(12) United States Patent
Ishido et al.

(10) Patent No.: US 12,368,004 B2
(45) Date of Patent: Jul. 22, 2025

(54) CAPACITOR AND METHOD FOR PRODUCING CAPACITOR

(71) Applicant: ROHM CO., LTD., Kyoto (JP)

(72) Inventors: Ryosuke Ishido, Kyoto (JP); Taketoshi Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 14 days.

(21) Appl. No.: 17/800,115

(22) PCT Filed: Dec. 9, 2020

(86) PCT No.: PCT/JP2020/045810
§ 371 (c)(1),
(2) Date: Aug. 16, 2022

(87) PCT Pub. No.: WO2021/181774
PCT Pub. Date: Sep. 16, 2021

(65) Prior Publication Data
US 2023/0074009 A1    Mar. 9, 2023

(30) Foreign Application Priority Data
Mar. 12, 2020 (JP) .................. 2020-043084

(51) Int. Cl.
*H01G 4/33* (2006.01)
*H01G 4/012* (2006.01)
*H01G 4/228* (2006.01)

(52) U.S. Cl.
CPC .............. *H01G 4/33* (2013.01); *H01G 4/012* (2013.01); *H01G 4/228* (2013.01)

(58) Field of Classification Search
CPC ........... H01G 4/228; H01G 4/012; H01G 4/33
See application file for complete search history.

(56) References Cited

U.S. PATENT DOCUMENTS

| | | | | |
|---|---|---|---|---|
| 2,939,059 A | * | 5/1960 | Gravley | C04B 35/468 361/308.1 |
| 8,027,145 B2 | * | 9/2011 | Yawata | H01G 9/055 361/311 |
| 2010/0307808 A1 | * | 12/2010 | Horiuchi | H05K 3/4605 174/264 |
| 2011/0013340 A1 | * | 1/2011 | Horiuchi | H05K 1/162 361/311 |

(Continued)

FOREIGN PATENT DOCUMENTS

| | | |
|---|---|---|
| CN | 103985541 A | 8/2014 |
| JP | 2009059990 A * | 3/2009 |

(Continued)

OTHER PUBLICATIONS

International Search Report for PCT/JP2020/045810, mailed on Mar. 9, 2021.

(Continued)

*Primary Examiner* — David M Sinclair
(74) *Attorney, Agent, or Firm* — Rabin & Berdo, P.C.

(57) ABSTRACT

A capacitor includes a substrate 2 that has a first principal surface at one side and a second principal surface at another side, a plurality of first internal electrode forming penetrating holes 3 that penetrate through the substrate in a thickness direction, a plurality of second internal electrode forming penetrating holes 4 that penetrate through the substrate in the thickness direction, first internal electrodes 5 that are constituted of conductors embedded inside the first internal electrode forming penetrating holes, and second internal electrodes 6 that are constituted of conductors embedded inside the second internal electrode forming penetrating holes. The plurality of internal electrode forming penetrating holes 3 and 4 that include the plurality of first internal electrode forming penetrating holes 3 and the plurality of second internal electrode forming penetrating holes 4 are disposed in a lattice in a plan view as viewed from a normal direction orthogonal to the first principal surface.

7 Claims, 18 Drawing Sheets

(56) References Cited

U.S. PATENT DOCUMENTS

| | | | |
|---|---|---|---|
| 2012/0300360 A1* | 11/2012 | Take | H01G 4/30 361/301.4 |
| 2013/0070388 A1 | 3/2013 | Take et al. | |
| 2013/0148259 A1* | 6/2013 | Masuda | H01G 4/302 29/25.03 |
| 2014/0063690 A1* | 3/2014 | Masuda | H01G 9/07 361/321.1 |
| 2014/0226257 A1* | 8/2014 | Take | H01G 4/1209 361/303 |

FOREIGN PATENT DOCUMENTS

| | | |
|---|---|---|
| JP | 2011023439 A | 2/2011 |
| JP | 2012-195481 A | 10/2012 |
| JP | 2014-154703 A | 8/2014 |
| JP | 2016-058618 A | 4/2016 |
| JP | 6555084 B2 | 8/2019 |

OTHER PUBLICATIONS

Written Opinion of the International Searching Authority for PCT/JP2020/045810, mailed on Mar. 9, 2021.

Notice of Reasons for Refusal dated Oct. 24, 2024, in the counterpart Japanese patent applications No. 2022-505765.

Notice of Reasons for Refusal dated Feb. 20, 2025, in the counterpart Japanese patent No. 2022-505765.

Chinese Office Action dated May 27, 2025, in the counterpart Chinese Patent Application No. 202080098369.4.

* cited by examiner

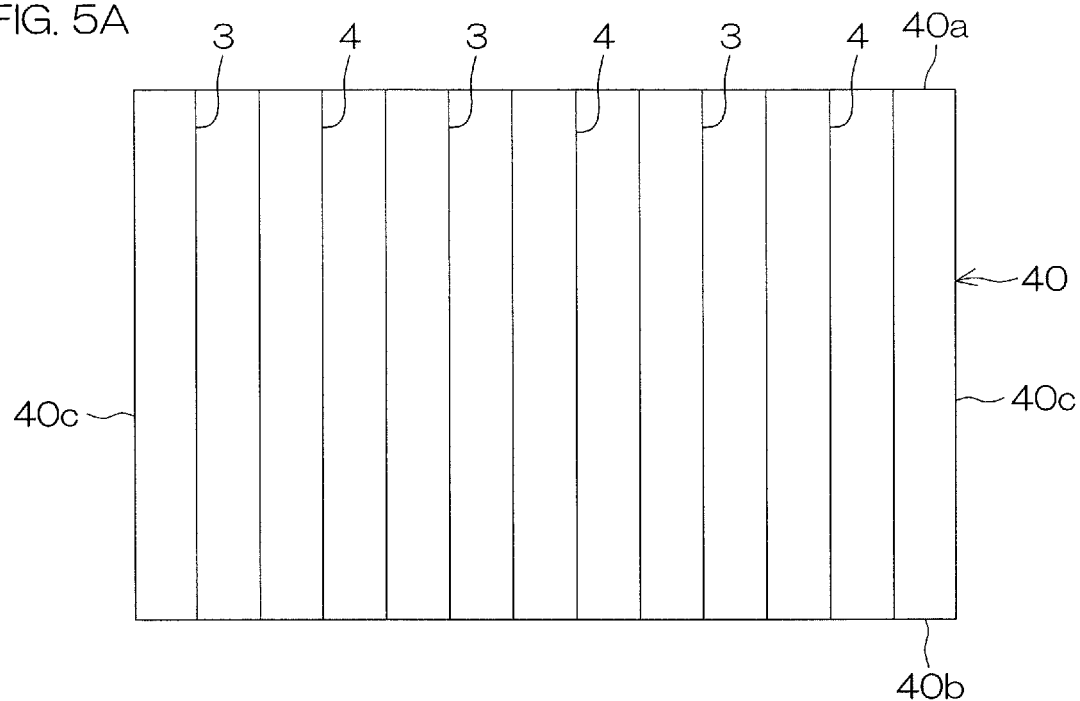
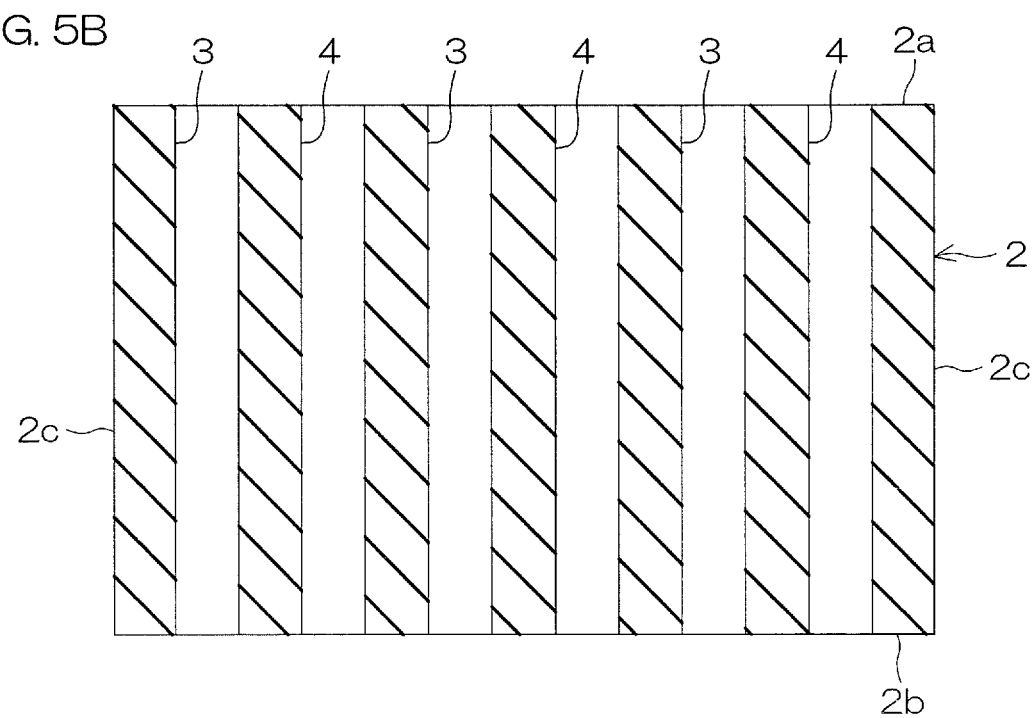

CAPACITOR AND METHOD FOR PRODUCING CAPACITOR

TECHNICAL FIELD

The present invention relates to a capacitor and a method for producing a capacitor.

BACKGROUND ART

A capacitance element having a first embedded electrode that is embedded in a first opening portion formed in a surface (upper surface) at one side of a base body and a second embedded electrode that is embedded in a second opening portion formed in a surface (lower surface) at another side of the base body is disclosed in FIG. 1 and FIG. 2 of Patent Literature 1. The base body is constituted of a silicon substrate and a silicon oxide layer (BOX layer) that is laminated on the silicon substrate. The first opening portion is a recess portion of an upper opening that does not penetrate through the base body. Also, the second opening portion is a recess portion of a lower opening that does not penetrate through the base body.

As shown in FIG. 2 of Patent Literature 1, the first embedded electrode and the second embedded electrode are configured as mutually meshed comb teeth in plan view. Also, it is disclosed in Patent Literature 1 that the first embedded electrode and the second embedded electrode may be arranged in plan view from a circular first embedded electrode that is disposed at a central portion and an annular second embedded electrode and an annular first embedded electrode that are disposed alternately and concentrically to the circular first embedded electrode as shown in FIG. 3 of Patent Literature 1.

CITATION LIST

Patent Literature

Patent Literature 1: Japanese Patent No. 6555084

SUMMARY OF INVENTION

Technical Problem

An object of the present invention is to provide a capacitor with a novel arrangement.

Also, an object of the present invention is to provide a novel method for producing a capacitor.

Solution to Problem

A preferred embodiment of the present invention provides a capacitor including a substrate that has a first principal surface at one side and a second principal surface at another side, a plurality of first internal electrode forming penetrating holes that penetrate through the substrate in a thickness direction, a plurality of second internal electrode forming penetrating holes that penetrate through the substrate in the thickness direction, first internal electrodes that are constituted of conductors embedded inside the first internal electrode forming penetrating holes, and second internal electrodes that are constituted of conductors embedded inside the second internal electrode forming penetrating holes, and where a plurality of internal electrode forming penetrating holes that include the plurality of first internal electrode forming penetrating holes and the plurality of second internal electrode forming penetrating holes are disposed in a lattice in a plan view as viewed from a normal direction orthogonal to the first principal surface. By the present preferred embodiment, a capacitor with a novel arrangement is obtained.

In the preferred embodiment of the present invention, the plurality of internal electrode forming penetrating holes are disposed in a matrix in the plan view.

In the preferred embodiment of the present invention, the plurality of internal electrode forming penetrating holes are disposed in a staggered arrangement in the plan view.

The preferred embodiment of the present invention includes a first external electrode that is disposed on the first principal surface and to which the plurality of first internal electrodes are electrically connected and a second external electrode that is disposed on the second principal surface and to which the plurality of second internal electrodes are electrically connected.

The preferred embodiment of the present invention further includes a first insulating film that is formed on the first principal surface such as to cover the first principal surface side end portions of the second internal electrodes and has first contact holes exposing the first principal surface side end portions of the first internal electrodes and a second insulating film that is formed on the second principal surface such as to cover the second principal surface side end portions of the first internal electrodes and has second contact holes exposing the second principal surface side end portions of the second internal electrodes, the first external electrode is formed on the first principal surface such as to cover at least a portion of exposed surfaces of the first insulating film and cover the first principal surface side end portions of the plurality of first internal electrodes, the second external electrode is formed on the second principal surface such as to cover at least a portion of exposed surfaces of the second insulating film and cover the second principal surface side end portions of the plurality of second internal electrodes, the first external electrode enters into the first contact holes and is connected to the first internal electrodes inside the first contact holes, and the second external electrode enters into the second contact holes and is connected to the second internal electrodes inside the second contact holes.

In the preferred embodiment of the present invention, an aspect ratio of the first internal electrode forming penetrating holes and the second internal electrode forming penetrating holes is not less than 50.

In the preferred embodiment of the present invention, a depth of the first internal electrode forming penetrating holes and the second internal electrode forming penetrating holes is not less than 100 µm.

In the preferred embodiment of the present invention, a maximum width or maximum diameter of a lateral cross section of the first internal electrode forming penetrating holes and the second internal electrode forming penetrating holes is not less than 0.3 µm and not more than 10 µm.

In the preferred embodiment of the present invention, a distance between electrodes of the plurality of internal electrodes including the first internal electrodes and the second internal electrodes is not less than 0.3 µm and not more than 10 µm.

In the preferred embodiment of the present invention, the conductors are constituted of one arbitrarily selected from among Cu, Al, Pt, Au, Ag, Ni, and polysilicon.

A preferred embodiment of the present invention provides a capacitor including a substrate that has a first principal surface at one side and a second principal surface at another side, a plurality of first internal electrode forming penetrating holes that penetrate through the substrate in a thickness direction, a plurality of second internal electrode forming penetrating holes that penetrate through the substrate in the thickness direction, first internal electrodes that are constituted of conductors embedded inside the first internal electrode forming penetrating holes, second internal electrodes that are constituted of conductors embedded inside the second internal electrode forming penetrating holes, a first insulating film that is formed on the first principal surface such as to cover the first principal surface side end portions of the second internal electrodes and has first contact holes exposing the first principal surface side end portions of the first internal electrodes, a second insulating film that is formed on the second principal surface such as to cover the second principal surface side end portions of the first internal electrodes and has second contact holes exposing the second principal surface side end portions of the second internal electrodes, a first external electrode that is formed on the first principal surface such as to cover at least a portion of exposed surfaces of the first insulating film and cover the first principal surface side end portions of the plurality of first internal electrodes and to which the plurality of first internal electrodes are electrically connected, and a second external electrode that is formed on the second principal surface such as to cover at least a portion of exposed surfaces of the second insulating film and cover the second principal surface side end portions of the plurality of second internal electrodes and to which the plurality of second internal electrodes are electrically connected. By the present preferred embodiment, a capacitor with a novel arrangement is obtained.

In the preferred embodiment of the present invention, the first external electrode enters into the first contact holes and is connected to the first internal electrodes inside the first contact holes and the second external electrode enters into the second contact holes and is connected to the second internal electrodes inside the second contact holes.

A preferred embodiment of the present invention provides a method for producing capacitor that includes a first step of forming, in a substrate having a first principal surface at one side and a second principal surface at another side, a plurality of first internal electrode forming penetrating holes that penetrate through the substrate in a thickness direction and a plurality of second internal electrode forming penetrating holes that penetrate through the substrate in the thickness direction and a second step of embedding conductors inside the first internal electrode forming penetrating holes and the second internal electrode forming penetrating holes to form first internal electrodes inside the first internal electrode forming penetrating holes and form second internal electrodes inside the second internal electrode forming penetrating holes. By the present preferred embodiment, a novel method for producing capacitor can be provided.

The preferred embodiment of the present invention further includes a third step of forming a first insulating layer on the first principal surface such as to cover the first principal surface side end portions of the first internal electrodes and the second internal electrodes, a fourth step of forming, in the first insulating layer, first contact holes exposing the first principal surface side end portions of the first internal electrodes, a fifth step of forming a second insulating layer on the second principal surface such as to cover the second principal surface side end portions of the first internal electrodes and the second internal electrodes, a sixth step of forming, in the second insulating layer, second contact holes exposing the second principal surface side end portions of the second internal electrodes, and seventh step of forming, on the first insulating film, a first external electrode that is connected to the first internal electrodes via the first contact holes and forming, on the second insulating film, a second external electrode that is connected to the second internal electrodes via the second contact holes.

In the preferred embodiment of the present invention, in the first step, a plurality of internal electrode forming penetrating holes that include the plurality of first internal electrode forming penetrating holes and the plurality of second internal electrode forming penetrating holes are formed in the substrate such as to be disposed in a lattice in a plan view as viewed from a normal direction orthogonal to the first principal surface.

In the preferred embodiment of the present invention, the plurality of internal electrode forming penetrating holes are formed in the substrate such as to be disposed in a matrix in the plan view.

In the preferred embodiment of the present invention, the plurality of internal electrode forming penetrating holes are formed in the substrate such as to be disposed in a staggered arrangement in the plan view.

The aforementioned as well as yet other objects, features, and effects of the present invention will be made clear by the following description of the preferred embodiments made with reference to the accompanying drawings.

BRIEF DESCRIPTION OF DRAWINGS

FIG. 5A is a sectional view of a portion of a production process of a semiconductor device shown in FIG. 1 and FIG. 2 and is a sectional view corresponding to a section plane of FIG. 2.

FIG. 5B is a sectional view of a step subsequent to that of FIG. 5A.

FIG. 2 is packaged.

DESCRIPTION OF EMBODIMENTS

Figure 1:
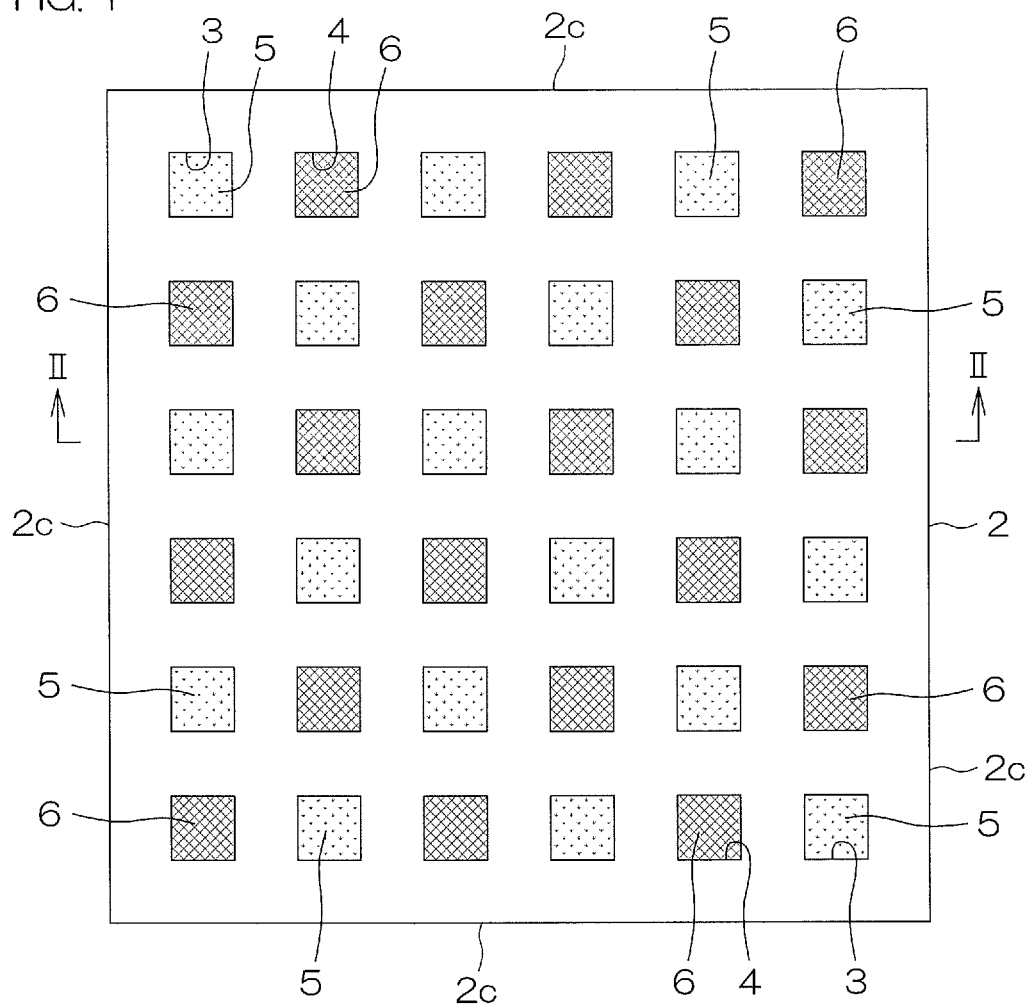
FIG. 1 is a schematic plan view of a capacitor according to a first preferred embodiment of the present invention.
Figure 2:
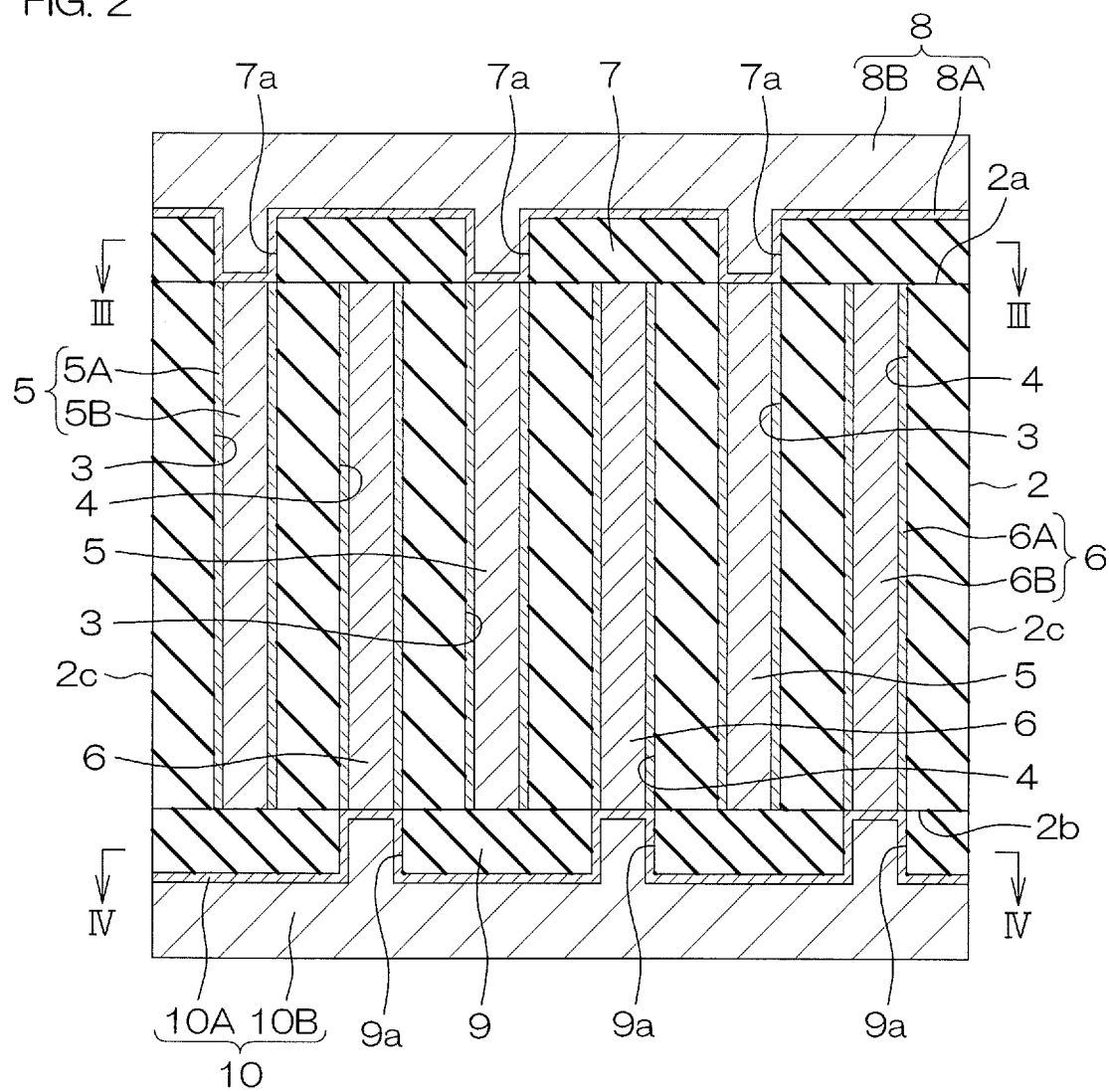
FIG. 2 is a schematic sectional view taken along line II-II of FIG. 1.
Figure 3:
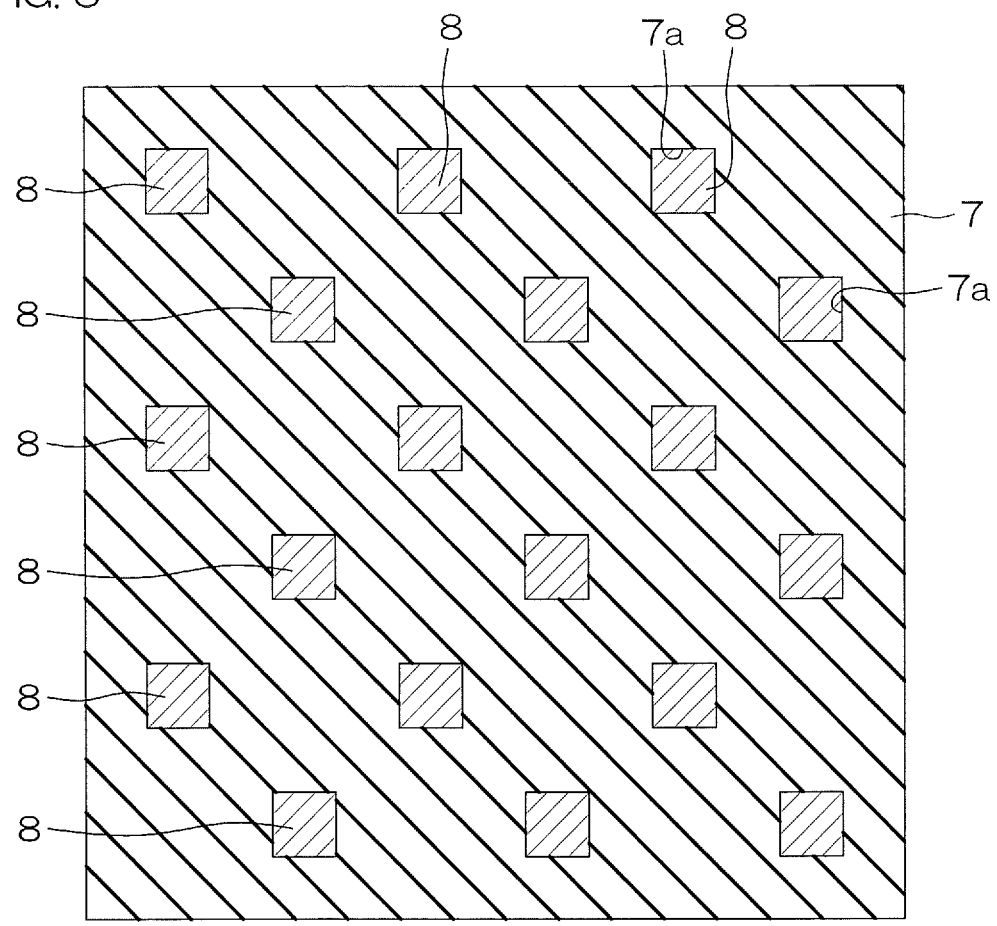
FIG. 3 is a schematic sectional view taken along line III-III of FIG. 2.
Figure 4:
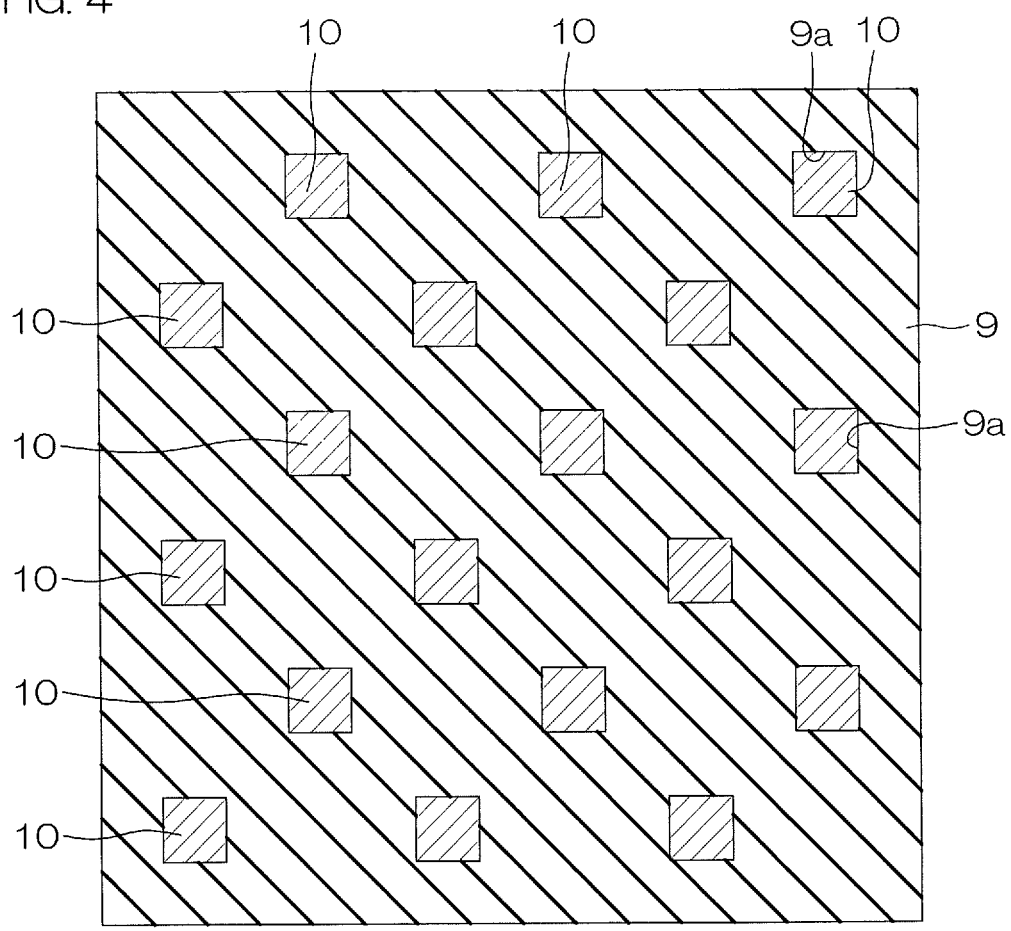
FIG. 4 is a schematic sectional view taken along line IV-IV of FIG. 2.

FIG. 1 is a schematic plan view of a capacitor according to a first preferred embodiment of the present invention. FIG. 2 is a schematic sectional view taken along line II-II of FIG. 1. FIG. 3 is a schematic sectional view taken along line III-III of FIG. 2. FIG. 4 is a schematic sectional view taken along line IV-IV of FIG. 2.

However, in FIG. 1, a first insulating film 7 and a first external electrode 8 of FIG. 2 are omitted. Also, in FIG. 1, in order to facilitate identification of first internal electrodes 5 and second internal electrodes 6, the first internal electrodes 5 are indicated by dot hatching and the second internal electrodes 6 are indicated by cross hatching.

Also, in the following, an up/down direction of FIG. 1 shall be referred to as a longitudinal direction and a right/left direction of FIG. 1 shall be referred to as a lateral direction.

Referring to FIG. 1 and FIG. 2, the capacitor 1 is of rectangular parallelepiped shape. The capacitor 1 includes a substrate 2.

The substrate 2 is of rectangular parallelepiped shape and includes a pair of principal surfaces 2a and 2b and four side surfaces 2c. Of the pair of principal surfaces 2a and 2b, the principal surface 2a at an upper surface side of FIG. 2 is called the "first principal surface 2a" and the principal surface 2b at an opposite side to the first principal surface 2a is called the "second principal surface 2b." In a plan view of viewing from a normal direction orthogonal to the first principal surface 2a, the substrate 2 is of square shape and a length of one side thereof is, for example, approximately 5 mm. The plan view shape of the substrate 2 may instead be a shape other than a square shape such as a rectangular shape, a circular shape, etc. Also, a thickness of the substrate 2 is, for example, not less than 100 μm and is, for example, approximately 400 μm in this preferred embodiment. In this preferred embodiment, the substrate 2 is constituted of silicon oxide ($SiO_2$) that is formed by thermal oxidation of a silicon substrate. Also, the substrate 2 may be a silicon substrate instead.

A plurality of first internal electrode forming penetrating holes 3 that penetrate through the substrate 2 in a thickness direction and a plurality of second internal electrode forming penetrating holes 4 that penetrate through the substrate 2 in the thickness direction are formed in the substrate 2. The plurality of internal electrode forming penetrating holes 3 and 4 that include the plurality of first internal electrode forming penetrating holes 3 and the plurality of second internal electrode forming penetrating holes 4 are disposed in a lattice in plan view. In this preferred embodiment, the plurality of internal electrode forming penetrating holes 3 and 4 are disposed in a matrix in plan view. In this preferred embodiment, the plurality of internal electrode forming penetrating holes 3 and 4 are disposed side by side at equal intervals in the longitudinal direction and the lateral direction in plan view.

In this preferred embodiment, a lateral cross-sectional shape of each of the internal electrode forming penetrating holes 3 and 4 is a square shape and a length of one side thereof is, for example, approximately not less than 0.3 μm and not more than 10 μm. In this preferred embodiment, the length of one side is, for example, approximately 5 μm. A depth of each of the internal electrode forming penetrating holes 3 and 4 is the same as the thickness of the substrate 2. The first internal electrode forming penetrating holes 3 and the second internal electrode forming penetrating holes 4 are disposed side by side alternately in each of the longitudinal direction and the lateral direction.

A first internal electrode 5 that is constituted of a conductor is embedded inside each first internal electrode forming penetrating hole 3. A second internal electrode 6 that is constituted of a conductor is embedded inside each second internal electrode forming penetrating hole 4. An interelectrode distance of the plurality of internal electrodes 5 and 6 that include the first internal electrodes 5 and the second internal electrodes 6 is approximately not less than 0.3 μm and not more than 10 μm.

The first internal electrodes 5 are each constituted of a seed layer 5A that is formed on inner surfaces of the first internal electrode forming penetrating hole 3 and an internal electrode layer 5B that is embedded in the first internal electrode forming penetrating hole 3 in a state of being surrounded by the seed layer 5A. In this preferred embodiment, the seed layer 5A and the internal electrode layer 5B are constituted of copper (Cu). The seed layer 5A and the internal electrode layer 5B may instead be constituted of Al, Pt, Au, Ag, Ni, or other metal or of polysilicon.

The second internal electrodes 6 are each constituted of a seed layer 6A that is formed on inner surfaces of the second internal electrode forming penetrating hole 4 and an internal electrode layer 6B that is embedded in the second internal electrode forming penetrating hole 4 in a state of being surrounded by the seed layer 6A. In this preferred embodiment, the seed layer 6A and the internal electrode layer 6B are constituted of copper (Cu). The seed layer 6A and the internal electrode layer 6B may instead be constituted of Al, Pt, Au, Ag, Ni, or other metal or of polysilicon.

Referring to FIG. 2 and FIG. 3, a first insulating film 7 is formed on the first principal surface 2a of the substrate 2 such as to cover the first principal surface 2a and the second internal electrodes 6. First contact holes 7a that expose first principal surface side end portions of the first internal electrodes 5 are formed in the first insulating film 7. The first insulating film 7 is constituted, for example, of an $SiO_2$ film. The first insulating film 7 may instead be constituted of an SiN film, an SiON film, etc. In this preferred embodiment, a plan view shape of the first contact holes 7a is a square shape of substantially equal size as a size of a lateral cross section of the first internal electrodes 5. The plan view shape of the first contact holes 7*a* may instead be a shape other than a square shape such as a rectangular shape, a circular shape, etc.

A first external electrode 8 is formed on the first principal surface 2*a* of the substrate 2 such as to cover at least a portion of exposed surfaces of the first insulating film 7 and cover the first principal surface side end portions of all of the first internal electrodes 5. The first external electrode 8 enters into the first contact holes 7*a* of the first insulating film 7 and is connected to the first principal surface side end portions of the first internal electrodes 5 inside the first contact holes 7*a*. The first external electrode 8 is thereby electrically connected to the first internal electrodes 5. In this preferred embodiment, among the exposed surfaces of the first insulating film 7, exposed surfaces besides outer side surfaces of the first insulating film 7 are covered by the first external electrode 8.

The first external electrode 8 is constituted of a seed layer 8A that is formed such as to cover the exposed surfaces (excluding the outer side surfaces) of the first insulating film 7 and exposed surfaces of the first principal surface side end portions of all of the first internal electrodes 5 and an external electrode layer 8B that is laminated on the seed layer 8A. In this preferred embodiment, the seed layer 8A and the external electrode layer 8B are constituted of copper (Cu). Besides Cu, the seed layer 8A may be constituted of Al, Pt, Au, Ag, Ni, etc. Besides Cu, the external electrode layer 8B may be constituted of Al, Pt, Au, Ag, Ni, etc.

Referring to FIG. 2 and FIG. 4, a second insulating film 9 is formed on the second principal surface 2*b* of the substrate 2 such as to cover the second principal surface 2*b* and the first internal electrodes 5. Second contact holes 9*a* that expose second principal surface side end portions of the second internal electrodes 6 are formed in the second insulating film 9. The second insulating film 9 is constituted, for example, of an $SiO_2$ film. The second insulating film 9 may instead be constituted of an SiN film, an SiON film, etc. In this preferred embodiment, a plan view shape of the second contact holes 9*a* is a square shape of substantially equal size as a size of a lateral cross section of the second internal electrodes 6. The plan view shape of the second contact holes 9*a* may instead be a shape other than a square shape such as a rectangular shape, a circular shape, etc.

A second external electrode 10 is formed on the second principal surface 2*b* of the substrate 2 such as to cover at least a portion of exposed surfaces of the second insulating film 9 and cover the second principal surface side end portions of all of the second internal electrodes 6. The second external electrode 10 enters into the second contact holes 9*a* of the second insulating film 9 and is connected to the second principal surface side end portions of the second internal electrodes 6 inside the second contact holes 9*a*. The second external electrode 10 is thereby electrically connected to the second internal electrodes 6. In this preferred embodiment, among the exposed surfaces of the second insulating film 9, exposed surfaces besides outer side surfaces of the second insulating film 9 are covered by the second external electrode 10.

The second external electrode 10 is constituted of a seed layer 10A that is formed such as to cover the exposed surfaces (excluding the outer side surfaces) of the second insulating film 9 and exposed surfaces of the second principal surface side end portions of all of the second internal electrodes 6 and an external electrode layer 10B that is laminated on the seed layer 10A. In this preferred embodiment, the seed layer 10A and the external electrode layer 10B are constituted of copper (Cu). Besides Cu, the seed layer 10A may be constituted of Al, Pt, Au, Ag, Ni, etc. Besides Cu, the external electrode layer 10B may be constituted of Al, Pt, Au, Ag, Ni, etc.

In the arrangement such as described above, a first internal electrode 5 and a second internal electrode 6 that are adjacent in the longitudinal direction have opposing surfaces that oppose each other in the longitudinal direction. Also, a wall of the substrate 2 that is sandwiched by the opposing surfaces of the first internal electrode 5 and the second internal electrode 6 that are adjacent in the longitudinal direction constitutes a capacitance film (dielectric film). One capacitor element is constituted by the one set of first internal electrode 5 and second internal electrode 6 that are adjacent in the longitudinal direction and the capacitance film therebetween.

Similarly, a first internal electrode 5 and a second internal electrode 6 that are adjacent in the lateral direction have opposing surfaces that oppose each other in the lateral direction. Also, a wall of the substrate 2 that is sandwiched by the opposing surfaces of the first internal electrode 5 and the second internal electrode 6 that are adjacent in the lateral direction constitutes a capacitance film (dielectric film). One capacitor element is constituted by the one set of first internal electrode 5 and second internal electrode 6 that are adjacent in the lateral direction and the capacitance film therebetween.

Also, since the plurality of first internal electrodes 5 are electrically connected to the first external electrode 8 and the plurality of second internal electrode 6 are electrically connected to the second external electrode 10, an arrangement in which all of the capacitor elements are connected in parallel is obtained. A capacitor with which size reduction and increased capacity can be achieved can thereby be provided.

Also, since the first internal electrodes 5 and the second internal electrodes 6 can be formed by forming the first internal electrode forming penetrating holes 3 and the second internal electrode forming penetrating holes 4 in the substrate 2 and embedding the conductors inside these internal electrode forming penetrating holes 3 and 4, production of the first internal electrodes 5 and the second internal electrodes 6 is easy. A capacitor that is easy to produce can thereby be provided.

FIG. 5A to FIG. 5E are sectional views for describing an example of a production process of the capacitor and show a section plane corresponding to FIG. 2.

First, as shown in FIG. 5A, a base substrate 40 that is to be a base of the substrate 2 is prepared. The base substrate 40 has a first principal surface 40*a*, a second principal surface 40*b* at an opposite side to the first principal surface 40*a*, and four side surfaces 40*c* that connect the first principal surface 40*a* and the second principal surface 40*b*. The base substrate 40 is a silicon substrate. The first internal electrode forming penetrating holes 3 and the second internal electrode forming penetrating holes 4 are formed in the base substrate 40, for example, by an electrochemical etching method. These internal electrode forming penetrating holes 3 and 4 may be formed by laser processing instead.

Next, as shown in FIG. 5B, an entirety of the base substrate 40 is made into a thermal oxide film by a thermal oxidation method. The base substrate 40 thereby becomes the substrate 2 that is constituted of $SiO_2$. The first principal surface 40*a* of the base substrate 40 becomes the first principal surface 2*a* of the substrate 2, the second principal surface 40*b* of the base substrate 40 becomes the second principal surface 2b of the substrate 2, and the side surfaces 40c of the base substrate 40 become the side surfaces 2c of the substrate 2.

Figure 5C:
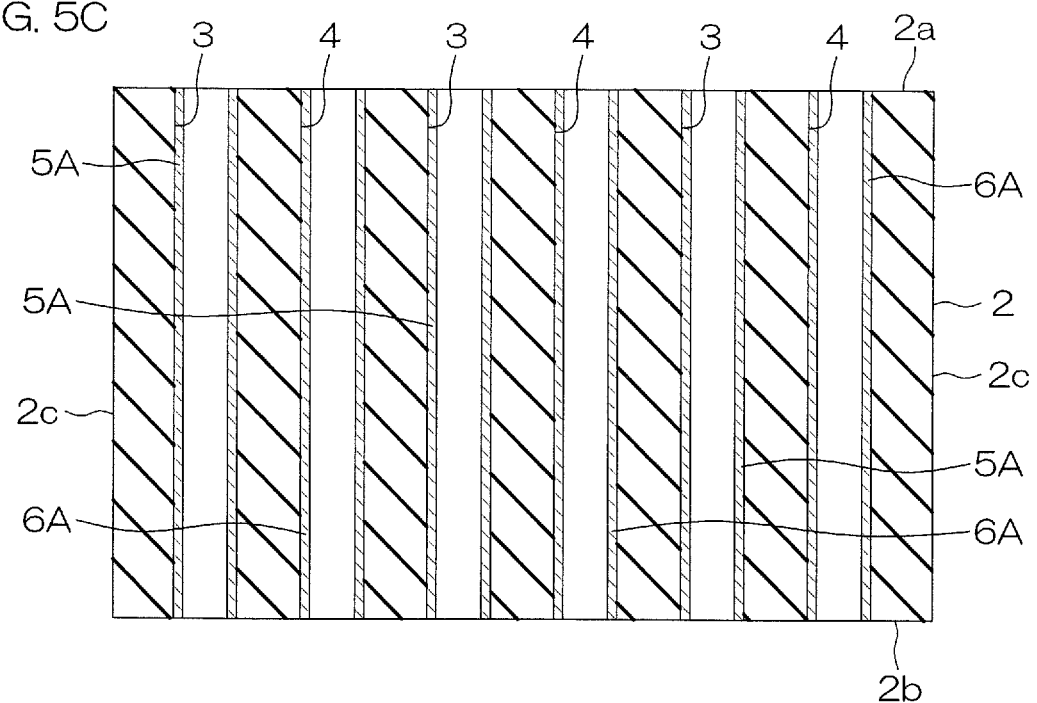
FIG. 5C is a sectional view of a step subsequent to that of FIG. 5B.

Next, as shown in FIG. 5C, the seed layers 5A are formed on the inner surfaces of the first internal electrode forming penetrating holes 3 and, at the same time, the seed layers 6A are formed on the inner surfaces of the second internal electrode forming penetrating holes 4. The seed layers 5A and 6A are, for example, Cu seed layers. The seed layers 5A and 6A are formed, for example, by an atomic layer deposition (ALD) method.

Figure 5D:
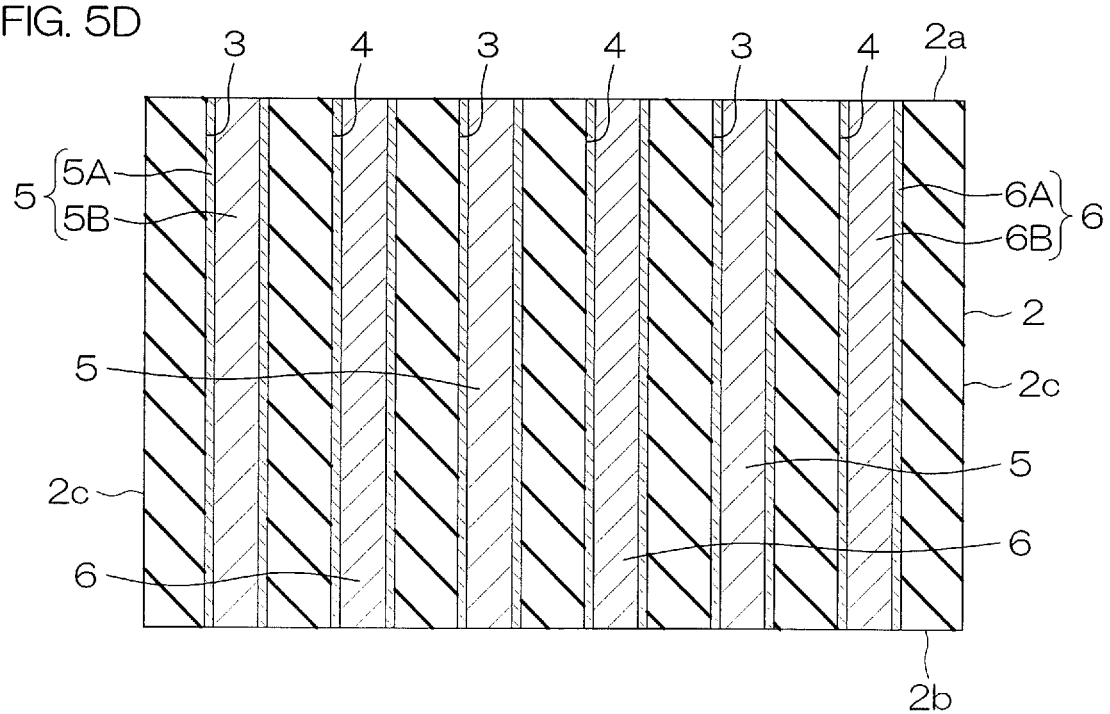
FIG. 5D is a sectional view of a step subsequent to that of FIG. 5C.

Next, as shown in FIG. 5D, for example, by a plating method, the internal electrode layers 5B are formed on the seed layers 5A inside the first internal electrode forming penetrating holes 3 and, at the same time, the internal electrode layers 6B are formed on the seed layers 6A inside the second internal electrode forming penetrating holes 4. The internal electrode layers 5B and the internal electrode layers 6B are constituted, for example, of Cu. A state in which the first internal electrodes 5, each constituted of the seed layer 5A and the internal electrode layer 5B, are embedded inside the first internal electrode forming penetrating holes 3 is thereby attained. Also, a state in which the second internal electrodes 6, each constituted of the seed layer 6A and the internal electrode layer 6B, are embedded inside the second internal electrode forming penetrating holes 4 is attained.

Figure 5E:
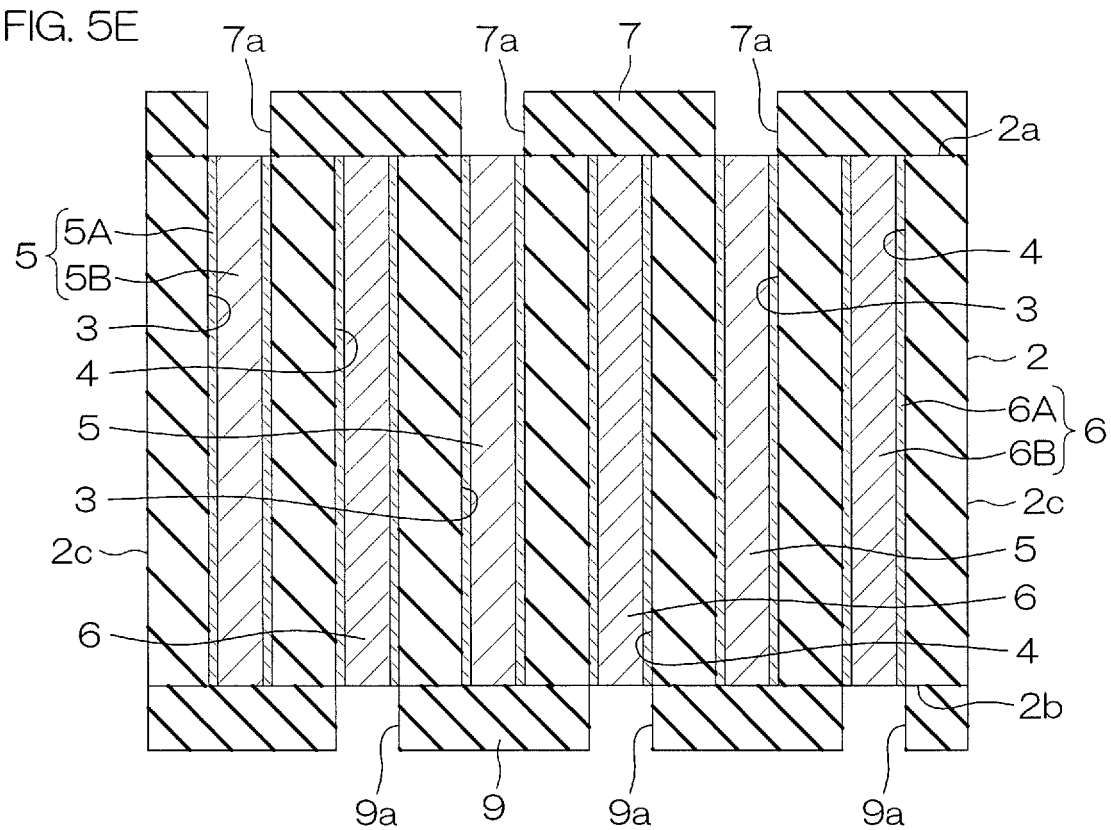
FIG. 5E is a sectional view of a step subsequent to that of FIG. 5D.

Next, as shown in FIG. 5E, the first insulating film 7 is formed, for example, by a sputtering method, on the first principal surface 2a of the substrate 2, such as to cover the first principal surface 2a, the first principal surface side end portions of the first internal electrodes 5, and the first principal surface side end portions of the second internal electrodes 6. The first insulating film 7 may be formed by a chemical vapor deposition (CVD) method. The first insulating film 7 is constituted, for example, of an $SiO_2$ film. The first contact holes 7a that expose the first principal surface side end portions of the first internal electrodes 5 are then formed in the first insulating film 7 by photolithography and etching.

Thereafter, the second insulating film 9 is formed, for example, by the sputtering method, on the second principal surface 2b of the substrate 2, such as to cover the second principal surface 2b, the second principal surface side end portions of the first internal electrodes 5, and the second principal surface side end portions of the second internal electrodes 6. The second insulating film 9 may be formed by a CVD method. The second insulating film 9 is constituted, for example, of an $SiO_2$ film. The second contact holes 9a that expose the second principal surface side end portions of the second internal electrodes 6 are then formed in the second insulating film 9 by photolithography and etching.

Lastly, by the first external electrode 8 being formed on the first principal surface 2a of the substrate 2 and the second external electrode 10 being formed on the second principal surface 2b of the substrate 2, the capacitor 1 shown in FIG. 1 and FIG. 2 is obtained.

The first external electrode 8 is formed, for example, as follows. First, for example, by the sputtering method, the seed layer 8A is formed such as to cover the exposed surfaces (excluding the outer side surfaces) of the first insulating film 7 and the exposed surfaces of the first principal surface side end portions of all of the first internal electrodes 5. Then, for example, by the plating method, the external electrode layer 8B is formed on the seed layer 8A. The first external electrode 8 that is constituted of the seed layer 8A and the external electrode layer 8B and is electrically connected to all of the first internal electrodes 5 is thereby formed on the first principal surface 2a.

The second external electrode 10 is formed, for example, as follows. First, for example, by the sputtering method, the seed layer 10A is formed such as to cover the exposed surfaces (excluding the outer side surfaces) of the second insulating film 9 and the exposed surfaces of the second principal surface side end portions of all of the second internal electrodes 6. Then, for example, by the plating method, the external electrode layer 10B is formed on the seed layer 10A. The second external electrode 10 that is constituted of the seed layer 10A and the external electrode layer 10B and is electrically connected to all of the second internal electrodes 6 is thereby formed on the second principal surface 2b.

FIG. 6 to FIG. 13 are each a plan view of a modification example that differs in either or both of the lateral cross-sectional shapes and positioning of the first internal electrode forming penetrating holes 3 and the second internal electrode forming penetrating holes 4 and are each a plan view that corresponds to FIG. 1. In FIG. 6 to FIG. 13, respective portions corresponding to those in FIG. 1 are indicated with the same reference signs attached as in FIG. 1.

Figure 6:
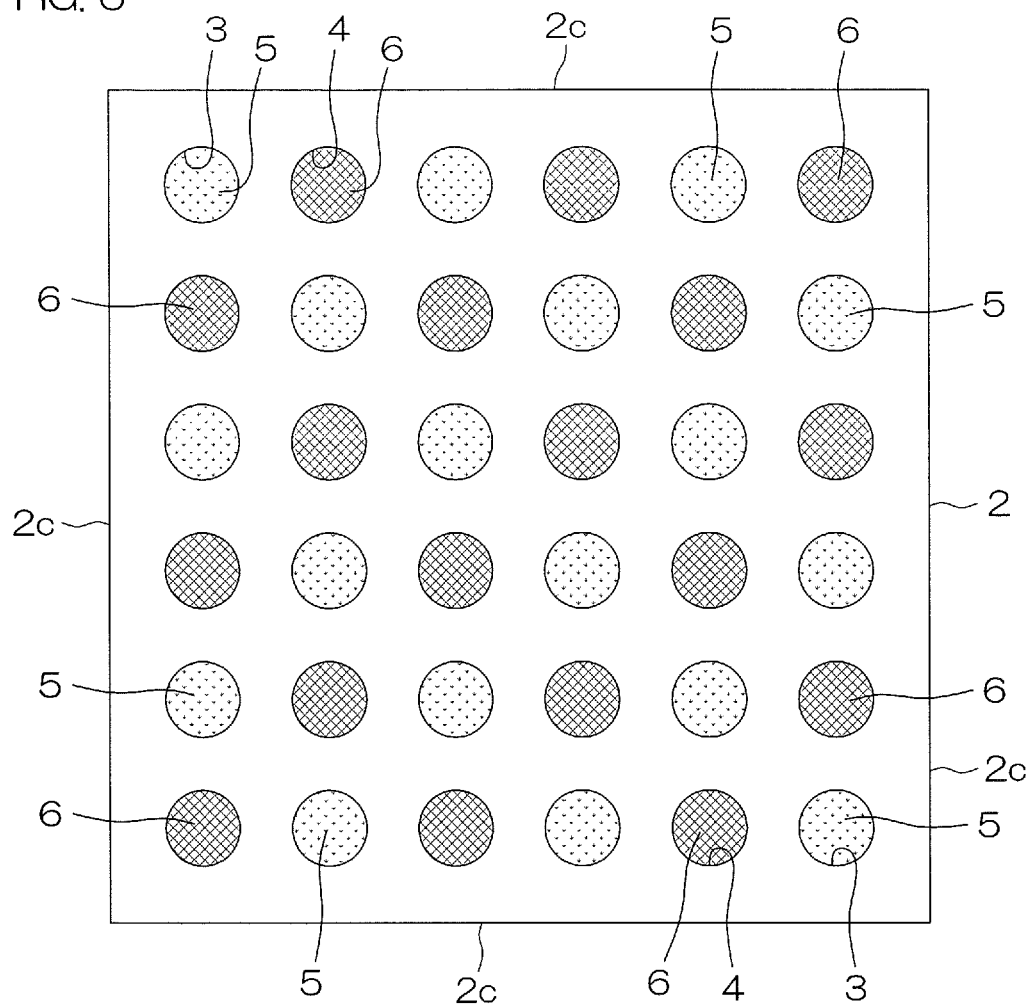
FIG. 6 is a schematic plan view of a modification example of lateral cross-sectional shapes of first internal electrode forming penetrating holes and second internal electrode forming penetrating holes.

As shown in FIG. 6, the lateral cross-sectional shapes of the first internal electrode forming penetrating holes 3 and the second internal electrode forming penetrating holes 4 may be circular shapes. In this case, the lateral cross-sectional shapes of the first internal electrodes 5 embedded in the first internal electrode forming penetrating holes 3 and the second internal electrodes 6 embedded in the second internal electrode forming penetrating holes 4 are also circular shapes.

Figure 7:
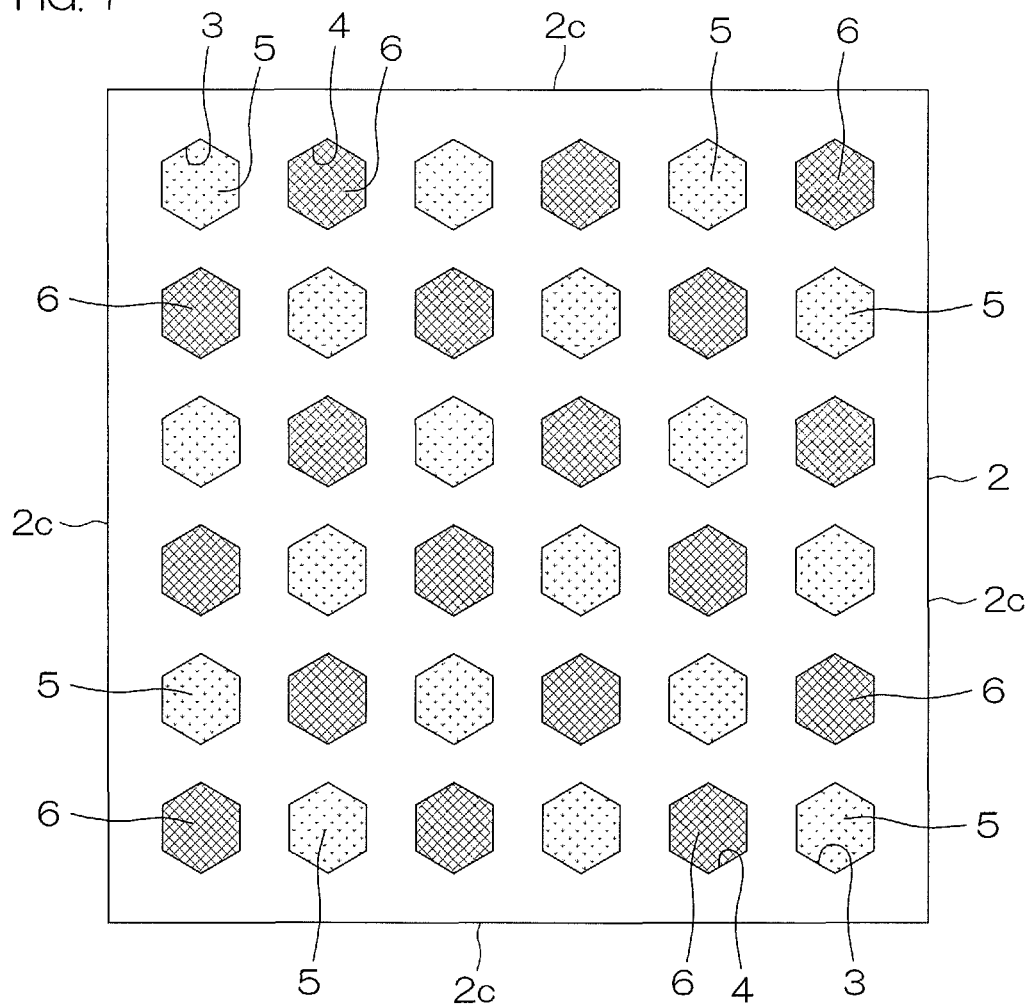
FIG. 7 is a schematic plan view of another modification example of the lateral cross-sectional shapes of the first internal electrode forming penetrating holes and the second internal electrode forming penetrating holes.

Also, as shown in FIG. 7, the lateral cross-sectional shapes of the first internal electrode forming penetrating holes 3 and the second internal electrode forming penetrating holes 4 may be regular hexagonal shapes. In this case, the lateral cross-sectional shapes of the first internal electrodes 5 embedded in the first internal electrode forming penetrating holes 3 and the second internal electrodes 6 embedded in the second internal electrode forming penetrating holes 4 are also regular hexagonal shapes.

Also, as shown in FIG. 8 to FIG. 12, the plurality of internal electrode forming penetrating holes 3 and 4 that include the plurality of first internal electrode forming penetrating holes 3 and the plurality of second internal electrode forming penetrating holes 4 may be disposed in a staggered arrangement in plan view.

Figure 8:
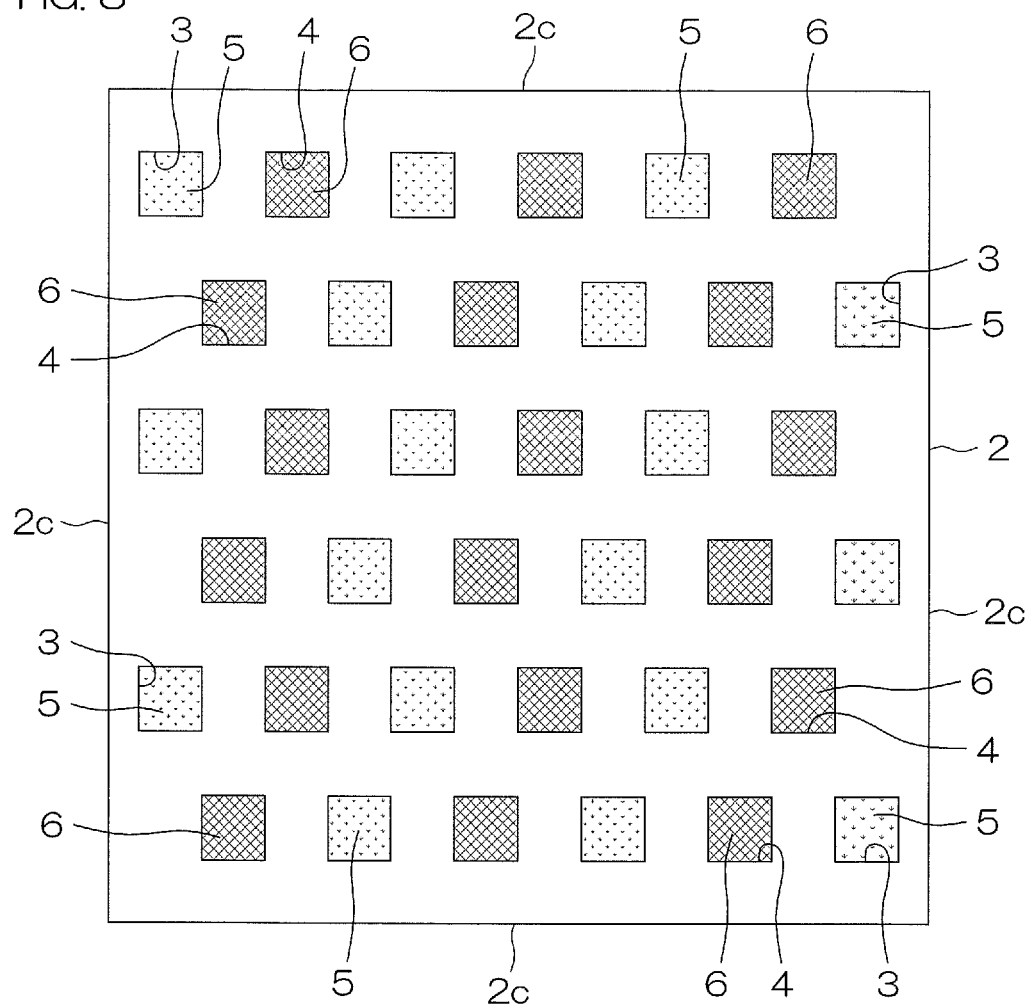
FIG. 8 is a schematic plan view of a modification example of a positioning of the first internal electrode forming penetrating holes and the second internal electrode forming penetrating holes.
Figure 9:
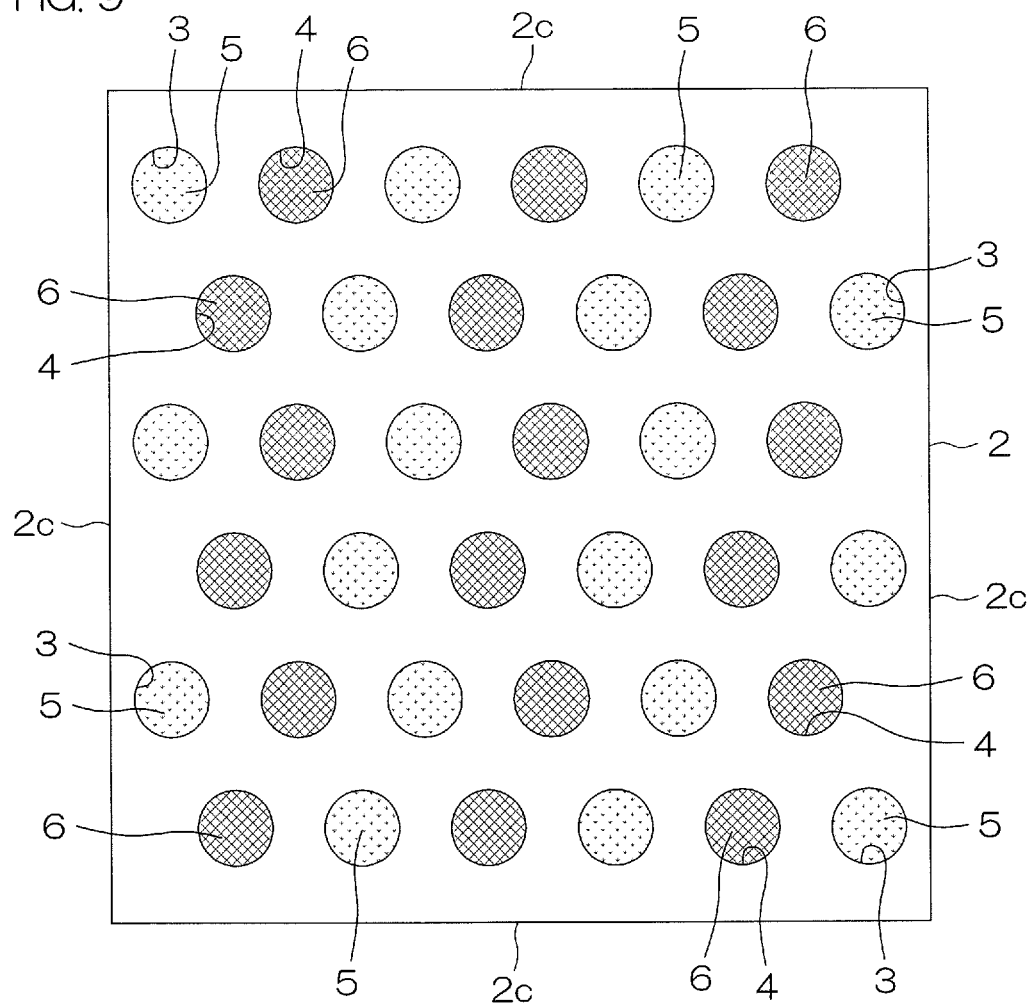
FIG. 9 is a schematic plan view of a modification example of the positioning and the lateral cross-sectional shapes of the first internal electrode forming penetrating holes and the second internal electrode forming penetrating holes.

In the example of FIG. 8, the lateral cross-sectional shape of each of the internal electrode forming penetrating holes 3 and 4 is a square shape as in FIG. 1. In the example of FIG. 8, the first internal electrode forming penetrating holes 3 and the second internal electrode forming penetrating holes 4 are disposed side by side alternately in just the lateral direction. In the example of FIG. 9, the lateral cross-sectional shape of each of the internal electrode forming penetrating holes 3 and 4 is a circular shape.

Figure 10:
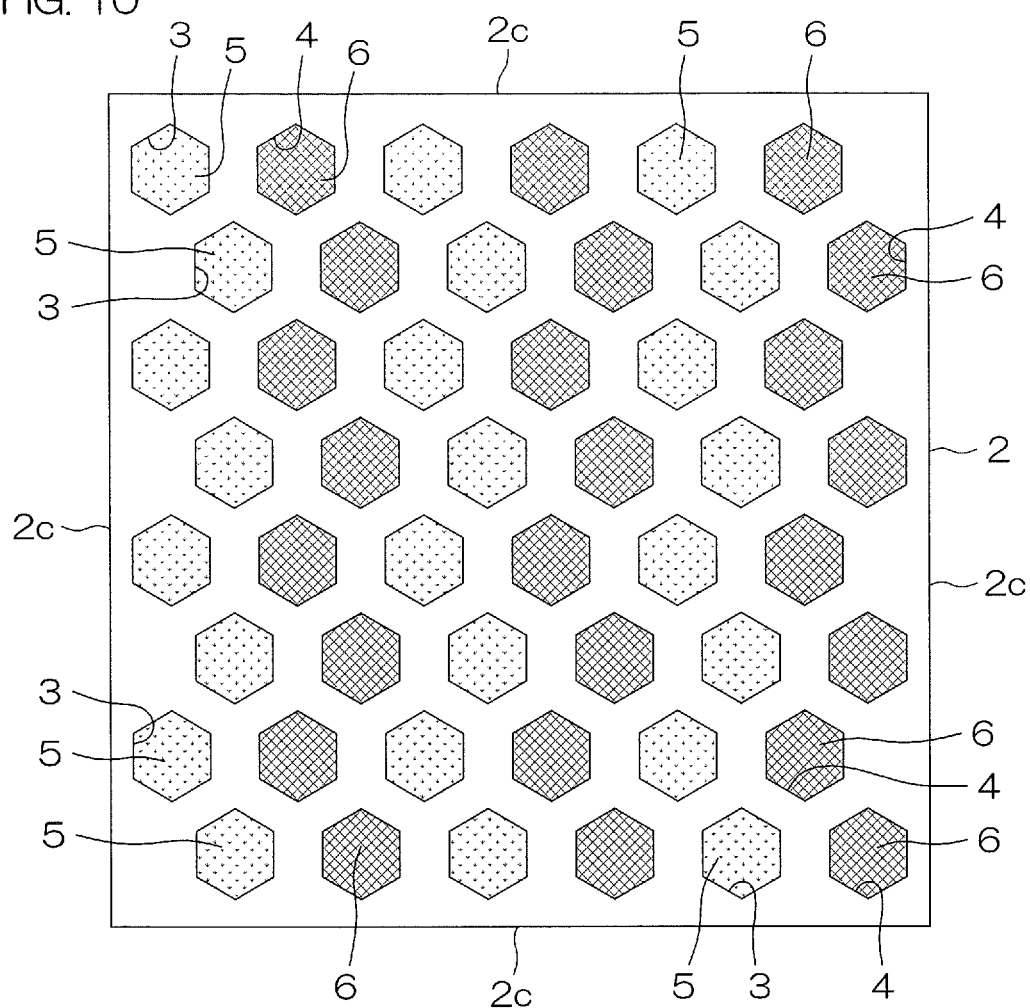
FIG. 10 is a schematic plan view of yet another modification example of the positioning and the lateral cross-sectional shapes of the first internal electrode forming penetrating holes and the second internal electrode forming penetrating holes.
Figure 11:
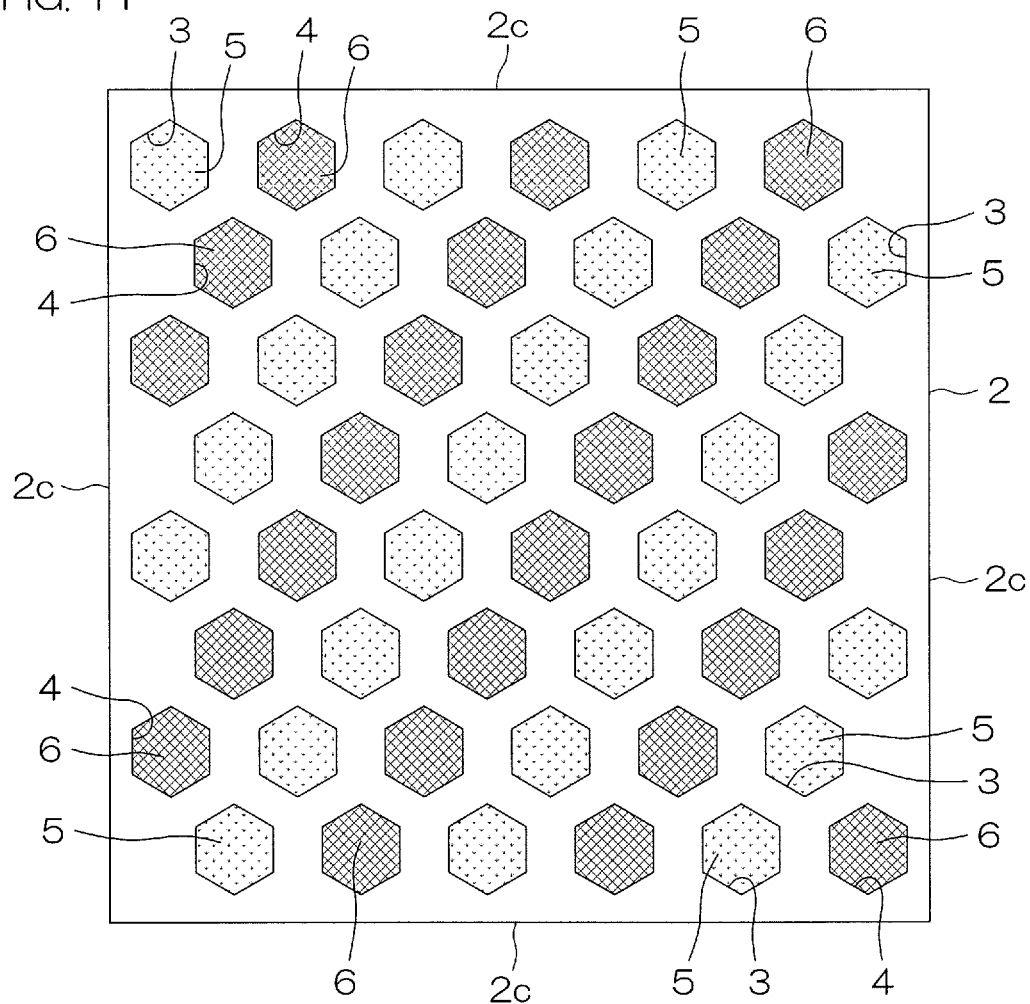
FIG. 11 is a schematic plan view of yet another modification example of the positioning and the lateral cross-sectional shapes of the first internal electrode forming penetrating holes and the second internal electrode forming penetrating holes.
Figure 12:
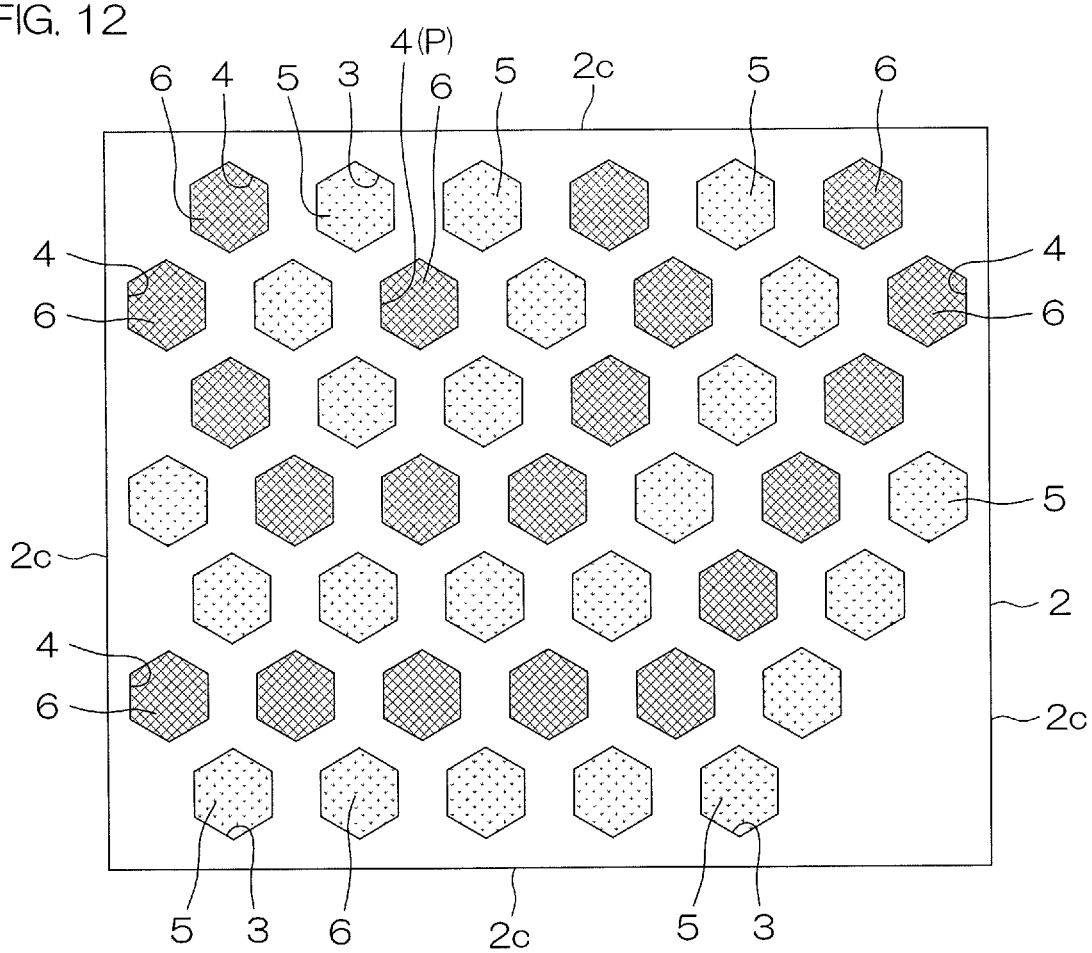
FIG. 12 is a schematic plan view of yet another modification example of the positioning and the lateral cross-sectional shapes of the first internal electrode forming penetrating holes and the second internal electrode forming penetrating holes.

In the examples of FIG. 10 to FIG. 12, the lateral cross-sectional shape of each of the internal electrode forming penetrating holes 3 and 4 is a regular hexagonal shape. In FIG. 10 to FIG. 12, an alignment of the internal electrode forming penetrating holes 3 and 4 in the lateral direction shall be referred to as a row, an alignment of the internal electrode forming penetrating holes 3 and 4 in the longitudinal direction shall be referred to as a column, and the respective rows shall be referred to as the first row, second row, third row, . . . , Nth row from the lower side to the upper side of the figure.

In the examples of FIG. 10 and FIG. 11, left ends of even-number rows are shifted to the left direction with respect to left ends of odd-number rows. In FIG. 10 and FIG. 11, in each row, the first internal electrode forming penetrating holes 3 and the second internal electrode forming penetrating holes 4 are disposed alternately in the lateral direction. However, in FIG. 10, in each row, a first internal electrode forming penetrating hole 3 is disposed at the left end.

On the other hand, in FIG. 11, the first internal electrode forming penetrating holes 3 and the second internal electrode forming penetrating holes 4 are disposed alternately in the longitudinal direction at the left ends of the odd-number rows and the first internal electrode forming penetrating holes 3 and the second internal electrode forming penetrating holes 4 are disposed alternately in the longitudinal direction at the left ends of the even-number rows.

In the example of FIG. 12, the internal electrode forming penetrating hole that is third from the left of the sixth row is a second internal electrode forming penetrating hole 4. If this second internal electrode forming penetrating hole 4 is deemed to be a basis penetrating hole 4 (indicated by 4(P) in FIG. 12), the first internal electrode forming penetrating holes 3 and the second internal electrode forming penetrating holes 4 are disposed alternately in substantially annular form or substantially arcuate form centered at the basis penetrating hole 4.

Figure 13:
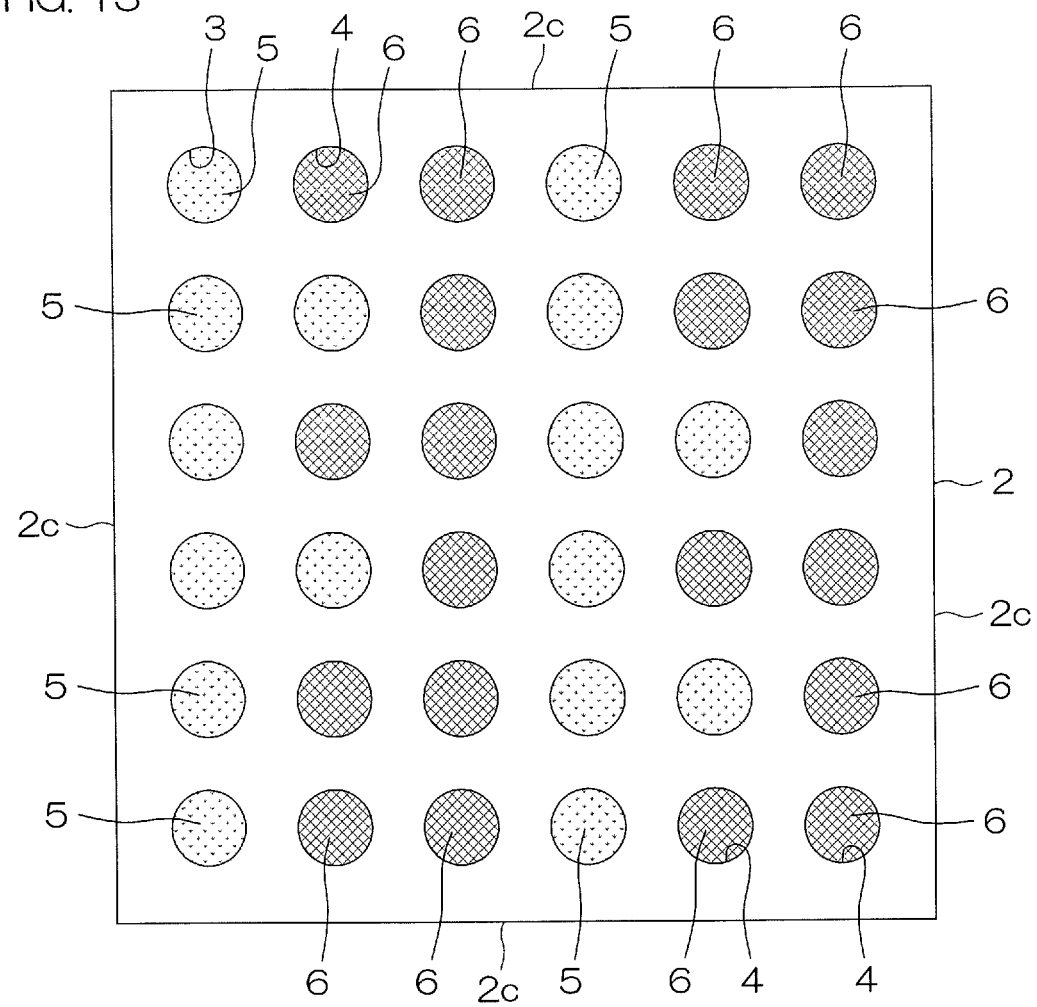
FIG. 13 is a schematic plan view of yet another modification example of the positioning and the lateral cross-sectional shapes of the first internal electrode forming penetrating holes and the second internal electrode forming penetrating holes.

In FIG. 13, although the lateral cross-sectional shape of each of the internal electrode forming penetrating holes 3 and 4 is circular, an overall positioning thereof in plan view is the same matrix form as in FIG. 1. However, the positioning of the first internal electrode forming penetrating holes 3 and the second internal electrode forming penetrating holes 4 differs from that of FIG. 1. In FIG. 13, an alignment of the internal electrode forming penetrating holes 3 and 4 in the lateral direction shall be referred to as a row, an alignment of the internal electrode forming penetrating holes 3 and 4 in the longitudinal direction shall be referred to as a column, the respective columns shall be referred to as the first column, second column, third column, . . . , sixth column from left to right and the respective rows shall be referred to as the first row, second row, third row, . . . , sixth matrix from below to above.

The first column and the fourth column are fully constituted of the first internal electrode forming penetrating holes 3. The third column and sixth column are fully constituted of the second internal electrode forming penetrating holes 4. In the second column, the third and fifth rows are constituted of the first internal electrode forming penetrating holes 3 and the first, second, fourth, and sixth rows are constituted of the second internal electrode forming penetrating holes 4. In the fifth column, the second and fourth rows are constituted of the first internal electrode forming penetrating holes 3 and the first, third, fifth, and sixth rows are constituted of the second internal electrode forming penetrating holes 4.

Figure 14:
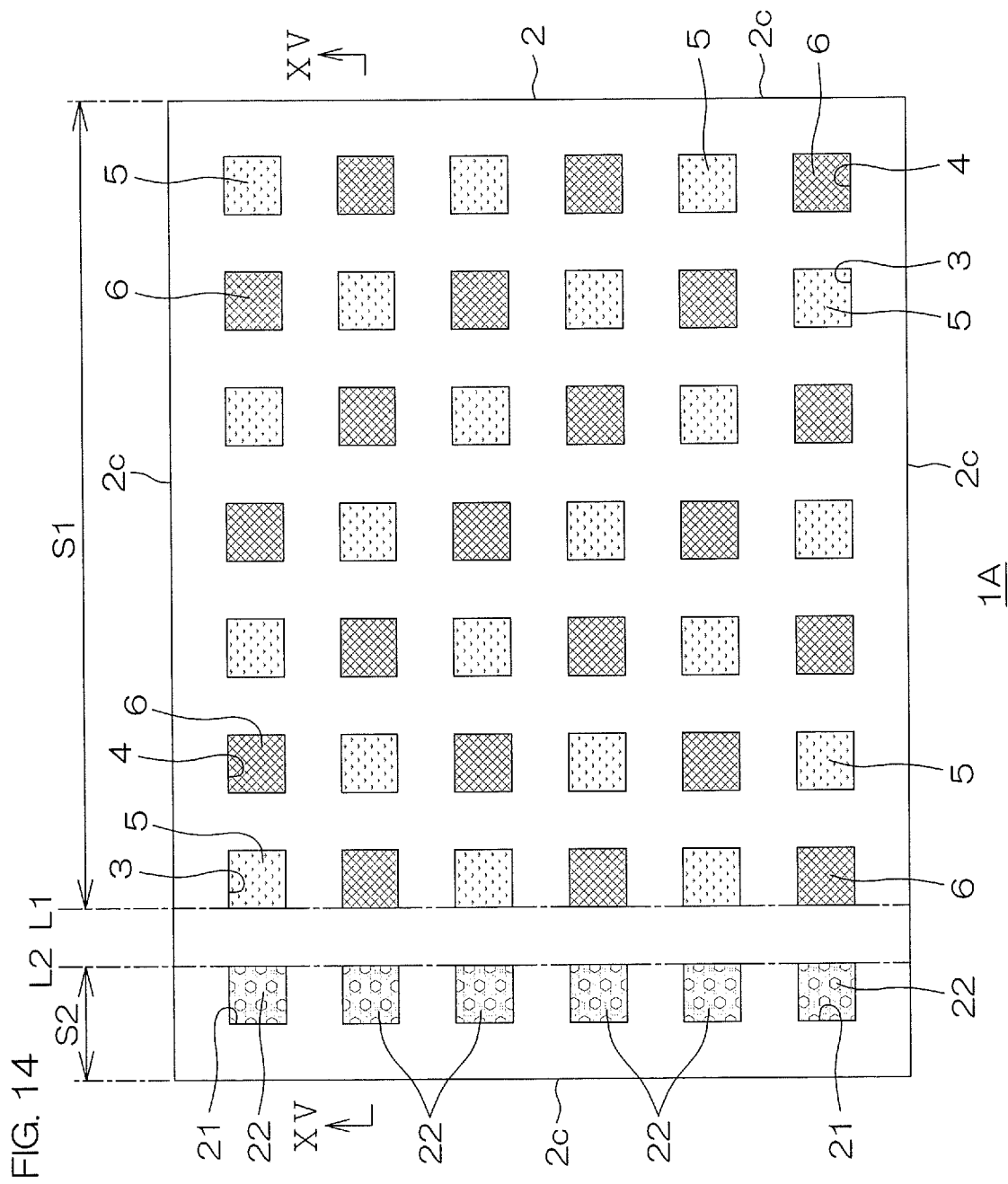
FIG. 14 is a schematic plan view of a capacitor according to a second preferred embodiment of the present invention.
Figure 15:
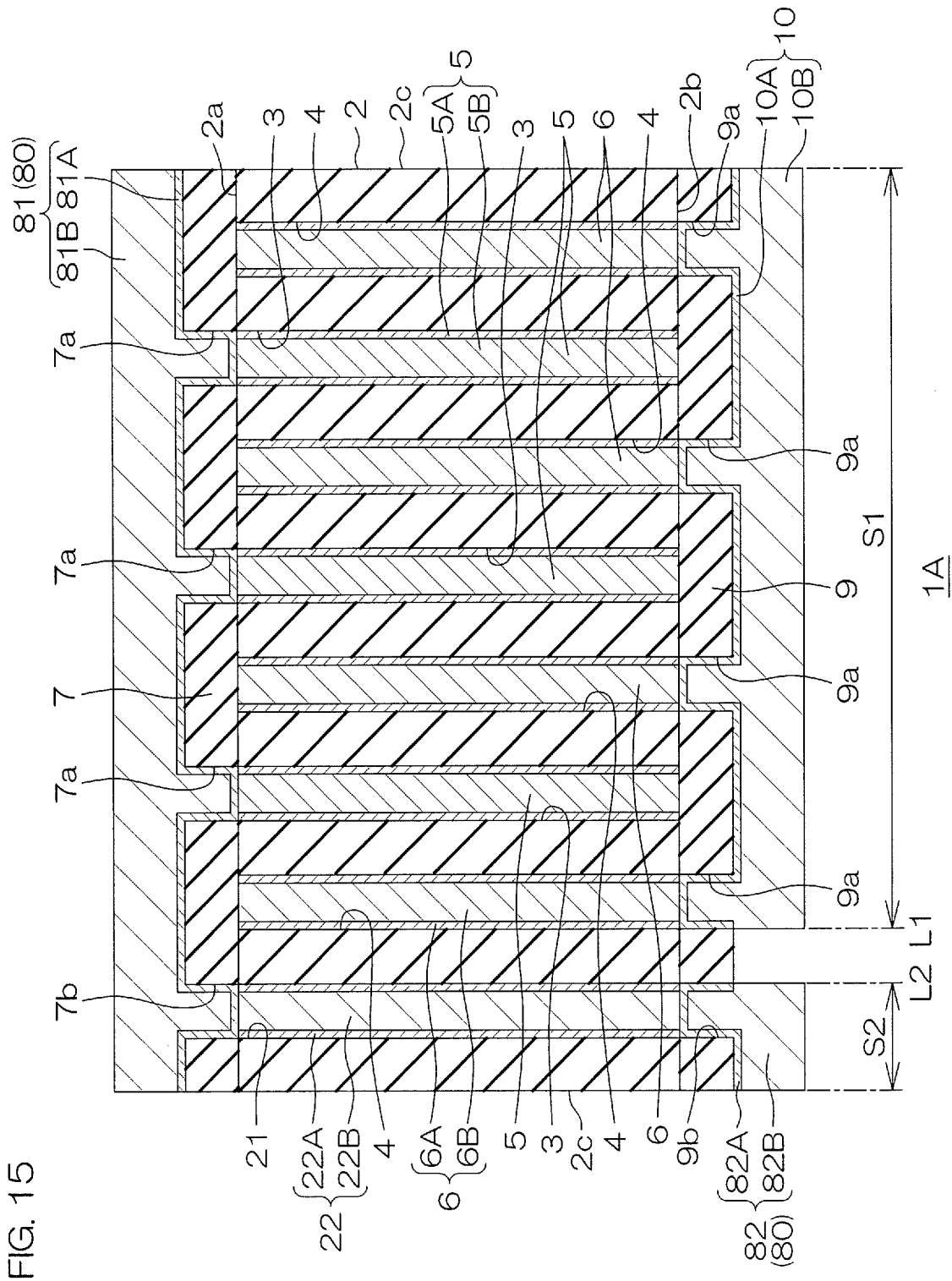
FIG. 15 is a schematic sectional view taken along line XV-XV of FIG. 14.

FIG. 14 is a schematic plan view of a capacitor according to a second preferred embodiment of the present invention. FIG. 15 is a schematic sectional view taken along line XV-XV of FIG. 14. However, in FIG. 14, the first insulating film 7 and a main first external electrode 81 of FIG. 15 are omitted. Also, in FIG. 14, in order to facilitate identification of the first internal electrodes 5 and the second internal electrodes 6, the first internal electrodes 5 are indicated by dot hatching and the second internal electrodes 6 are indicated by cross hatching.

In FIG. 14, portions corresponding to respective portions in FIG. 1 are indicated with the same reference signs attached as in FIG. 1. In FIG. 15, portions corresponding to respective portions in FIG. 2 are indicated with the same reference signs attached as in FIG. 2.

In the following, an up/down direction of FIG. 14 shall be referred to as a longitudinal direction and a right/left direction of FIG. 14 shall be referred to as a lateral direction.

The capacitor 1A is of rectangular parallelepiped shape. The capacitor 1A includes the substrate 2.

The substrate 2 is of rectangular parallelepiped shape and includes the pair of principal surfaces 2a and 2b and the four side surfaces 2c. Of the pair of principal surfaces 2a and 2b, the principal surface 2a at an upper surface side of FIG. 15 is called the "first principal surface 2a" and the principal surface 2b at an opposite side to the first principal surface 2a is called the "second principal surface 2b." In the plan view of viewing from the normal direction orthogonal to the first principal surface 2a, the substrate 2 is of rectangular shape, a length of a long side thereof is, for example, approximately 10 mm, and a length of a short side thereof is, for example, approximately 5 mm. Also, a thickness of the substrate 2 is, for example, not less than 100 μm and is, for example, approximately 400 μm in this preferred embodiment. In this preferred embodiment, the substrate 2 is constituted of silicon oxide ($SiO_2$) that is formed by thermal oxidation of a silicon substrate. Also, the substrate 2 may be a silicon substrate instead.

A plurality of first internal electrode forming penetrating holes 3, a plurality of second internal electrode forming penetrating holes 4, and a plurality of external electrode connection penetrating holes 21 that penetrate through the substrate 2 in the thickness direction are formed in the substrate 2. The plurality of internal electrode forming penetrating holes 3 and 4 that include the plurality of first internal electrode forming penetrating holes 3 and the plurality of second internal electrode forming penetrating holes 4 are disposed in a matrix in plan view. In this preferred embodiment, the plurality of internal electrode forming penetrating holes 3 and 4 are disposed side by side at equal intervals in the longitudinal direction and the lateral direction in plan view.

In plan view, the plurality of external electrode connection penetrating holes 21 are disposed side by side in the longitudinal direction at one side (in this example, the left side of FIG. 14) of the plurality of internal electrode forming penetrating holes 3 and 4 that are disposed in a matrix. In this preferred embodiment, the plurality of penetrating holes 3, 4, and 21 that include the plurality of first internal electrode forming penetrating holes 3, the plurality of second internal electrode forming penetrating holes 4, and the plurality of external electrode connection penetrating holes 21 are also disposed in a matrix. In this preferred embodiment, the plurality of penetrating holes 3, 4, and 21 are disposed side by side at equal intervals in the longitudinal direction and the lateral direction in plan view.

In this preferred embodiment, a lateral cross-sectional shape of each of the penetrating holes 3, 4, and 21 is a square shape and a length of one side thereof is, for example, approximately not less than 0.3 μm and not more than 10 μm. In this preferred embodiment, the length of one side is, for example, approximately 5 μm.

The first internal electrode forming penetrating holes 3 and the second internal electrode forming penetrating holes 4 are disposed side by side alternately in each of the longitudinal direction and the lateral direction.

On the second principal surface 2b of the substrate 2, a region further to the right side than a virtual straight line L1 in the longitudinal direction that passes through left ends of the internal electrode forming penetrating holes 3 and 4 in plan view shall be referred to as a first region S1. Also, on the second principal surface 2b of the substrate 2, a region further to the left side than a virtual straight line L2 in the longitudinal direction that passes through right ends of the external electrode connection penetrating holes 21 in plan view shall be referred to as a second region S2.

The first internal electrode 5 that is constituted of a conductor is embedded inside each first internal electrode forming penetrating hole 3. The second internal electrode 6 that is constituted of a conductor is embedded inside each second internal electrode forming penetrating hole 4. An external electrode connecting member 22 that is constituted of a conductor is embedded inside each external electrode connection penetrating hole 21. The interelectrode distance of the plurality of internal electrodes 5 and 6 that include the first internal electrodes 5 and the second internal electrodes 6 is approximately not less than 0.3 μm and not more than 10 μm.

The first internal electrodes 5 are each constituted of the seed layer 5A that is formed on the inner surfaces of the first internal electrode forming penetrating hole 3 and the internal electrode layer 5B that is embedded in the first internal electrode forming penetrating hole 3 in the state of being surrounded by the seed layer 5A. In this preferred embodiment, the seed layer 5A and the internal electrode layer 5B are constituted of copper (Cu). The seed layer 5A and the internal electrode layer 5B may instead be constituted of Al, Pt, Au, Ag, Ni, or other metal or of polysilicon.

The second internal electrodes 6 are each constituted of the seed layer 6A that is formed on the inner surfaces of the second internal electrode forming penetrating hole 4 and the internal electrode layer 6B that is embedded in the second internal electrode forming penetrating hole 4 in the state of being surrounded by the seed layer 6A. In this preferred embodiment, the seed layer 6A and the internal electrode layer 6B are constituted of copper (Cu). The seed layer 6A and the internal electrode layer 6B may instead be constituted of Al, Pt, Au, Ag, Ni, or other metal or of polysilicon.

The external electrode connecting members 22 are each constituted of a seed layer 22A that is formed on inner surfaces of the external electrode connection penetrating hole 21 and an external electrode connecting layer 22B that is embedded in the external electrode connection penetrating hole 21 in a state of being surrounded by the seed layer 22A. In this preferred embodiment, the seed layer 22A and the external electrode connecting layer 22B are constituted of copper (Cu). The seed layer 22A and the external electrode connecting layer 22B may instead be constituted of Al, Pt, Au, Ag, Ni, or other metal or of polysilicon.

The first insulating film 7 is formed on the first principal surface 2a of the substrate 2 such as to cover the first principal surface 2a and the second internal electrodes 6. The first contact holes 7a that expose the first principal surface side end portions of the first internal electrodes 5 and third contact holes 7b that expose first principal surface side end portions of the external electrode connecting members 22 are formed in the first insulating film 7. The first insulating film 7 is constituted, for example, of an $SiO_2$ film. The first insulating film 7 may instead be constituted of an SiN film, an SiON film, etc. In this preferred embodiment, plan view shapes of the first contact holes 7a and the third contact holes 7b are respectively square shapes of substantially equal sizes as sizes of lateral cross sections of the first internal electrodes 5 and the external electrode connecting members 22.

A main first external electrode 81 is formed on the first principal surface 2a of the substrate 2 such as to cover at least a portion of exposed surfaces of the first insulating film 7 and cover the first principal surface side end portions of all of the first internal electrodes 5. The main first external electrode 81 enters into the first contact holes 7a of the first insulating film 7 and is connected to the first principal surface side end portions of the first internal electrodes 5 inside the first contact holes 7a. The main first external electrode 81 is thereby electrically connected to the first internal electrodes 5. In this preferred embodiment, among the exposed surfaces of the first insulating film 7, the exposed surfaces besides outer side surfaces of the first insulating film 7 are covered by the main first external electrode 81.

Also, the main first external electrode 81 enters into the third contact holes 7b and is connected to the first principal surface side end portions of the external electrode connecting members 22 inside the third contact holes 7b. The main first external electrode 81 is thereby electrically connected to the external electrode connecting members 22.

The main first external electrode 81 is constituted of a seed layer 81A that is formed such as to cover the exposed surfaces (excluding the outer side surfaces) of the first insulating film 7, the exposed surfaces of the first principal surface side end portions of all of the first internal electrodes 5, and the first principal surface side end portions of all of the external electrode connecting members 22 and an external electrode layer 81B that is laminated on the seed layer 81A. In this preferred embodiment, the seed layer 81A and the external electrode layer 81B are constituted of copper (Cu). Besides Cu, the seed layer 81A may be constituted of Al, Pt, Au, Ag, Ni, etc. Besides Cu, the external electrode layer 81B may be constituted of Al, Pt, Au, Ag, Ni, etc.

The second insulating film 9 is formed on the second principal surface 2b of the substrate 2 such as to cover the second principal surface 2b and the first internal electrodes 5. The second contact holes 9a that expose the second principal surface side end portions of the second internal electrodes 6 and fourth contact holes 9b that expose second principal surface side end portions of the external electrode connecting members 22 are formed in the second insulating film 9. The second insulating film 9 is constituted, for example, of an $SiO_2$ film. The second insulating film 9 may instead be constituted of an SiN film, an SiON film, etc. In this preferred embodiment, plan view shapes of the second contact holes 9a and the fourth contact holes 9b are respectively square shapes of substantially equal sizes as sizes of lateral cross sections of the second internal electrodes 6 and the external electrode connecting members 22.

The second external electrode 10 is formed on the second principal surface 2b of the substrate 2 in the first region S1 such as to cover at least a portion of exposed surfaces of the second insulating film 9 and cover the second principal surface side end portions of the second internal electrodes 6. The second external electrode 10 enters into the second contact holes 9a of the second insulating film 9 and is connected to the second principal surface side end portions of the second internal electrodes 6 inside the second contact holes 9a. The second external electrode 10 is thereby electrically connected to the second internal electrodes 6. In this preferred embodiment, among the exposed surfaces of the second insulating film 9 in the first region S1, exposed surfaces besides outer side surfaces of the second insulating film 9 are covered by the second external electrode 10.

In the first region S1, the second external electrode 10 is constituted of the seed layer 10A that is formed such as to cover the exposed surfaces (excluding the outer side surfaces) of the second insulating film 9 and the exposed surfaces of the second principal surface side end portions of all of the second internal electrodes 6 and the external electrode layer 10B that is laminated on the seed layer 10A. In this preferred embodiment, the seed layer 10A and the external electrode layer 10B are constituted of copper (Cu). Besides Cu, the seed layer 10A may be constituted of Al, Pt, Au, Ag, Ni, etc. Besides Cu, the external electrode layer 10B may be constituted of Al, Pt, Au, Ag, Ni, etc.

Also, a sub first external electrode 82 is formed on the second principal surface 2b of the substrate 2 in the second region S2 such as to cover at least a portion of the exposed surfaces of the second insulating film 9 and cover the second principal surface side end portions of all of the external electrode connecting members 22. The sub first external electrode 82 enters into the fourth contact holes 9b of the second insulating film 9 and is connected to the second principal surface side end portions of the external electrode connecting members 22 inside the fourth contact holes 9b. The sub first external electrode 82 is thereby electrically connected to the external electrode connecting members 22. In this preferred embodiment, among the exposed surfaces of the second insulating film 9 in the second region S2, exposed surfaces besides outer side surfaces of the second insulating film 9 are covered by the sub first external electrode 82.

The sub first external electrode 82 is thereby electrically connected to the main first external electrode 81 via the external electrode connecting members 22. That is, in this preferred embodiment, the first external electrode 80 is constituted of the main first external electrode 81 and the sub first external electrode 82. In other words, the first external electrode 80 includes the main first external electrode 81 that is formed at the first principal surface 2a side of the substrate 2 and the sub first external electrode 82 that is formed at the second principal surface 2b side of the substrate 2.

In the second region S2, the sub first external electrode 82 is constituted of a seed layer 82A that is formed such as to cover the exposed surfaces (excluding the outer side surfaces) of the second insulating film 9 and exposed surfaces of the second principal surface side end portions of all of the external electrode connecting members 22 and an external electrode layer 82B that is laminated on the seed layer 82A. In this preferred embodiment, the seed layer 82A and the external electrode layer 82B are constituted of copper (Cu). Besides Cu, the seed layer 82A may be constituted of Al, Pt, Au, Ag, Ni, etc. Besides Cu, the external electrode layer 82B may be constituted of Al, Pt, Au, Ag, Ni, etc.

In this preferred embodiment, the first external electrode 80 includes the main first external electrode 81 that is formed at the first principal surface 2a side of the substrate 2 and the sub first external electrode 82 that is formed at the second principal surface 2b side of the substrate 2. Therefore, wiring for connecting to the first external electrode 80 can be connected to the main first external electrode 81 that is formed at the first principal surface 2a side of the substrate 2 and can also be connected to the sub first external electrode 82 that is formed at the second principal surface 2b side of the substrate 2. Also, the second external electrode 10 and the sub first external electrode 82 can also be connected directly to a wiring pattern on a printed substrate.

Figure 16:
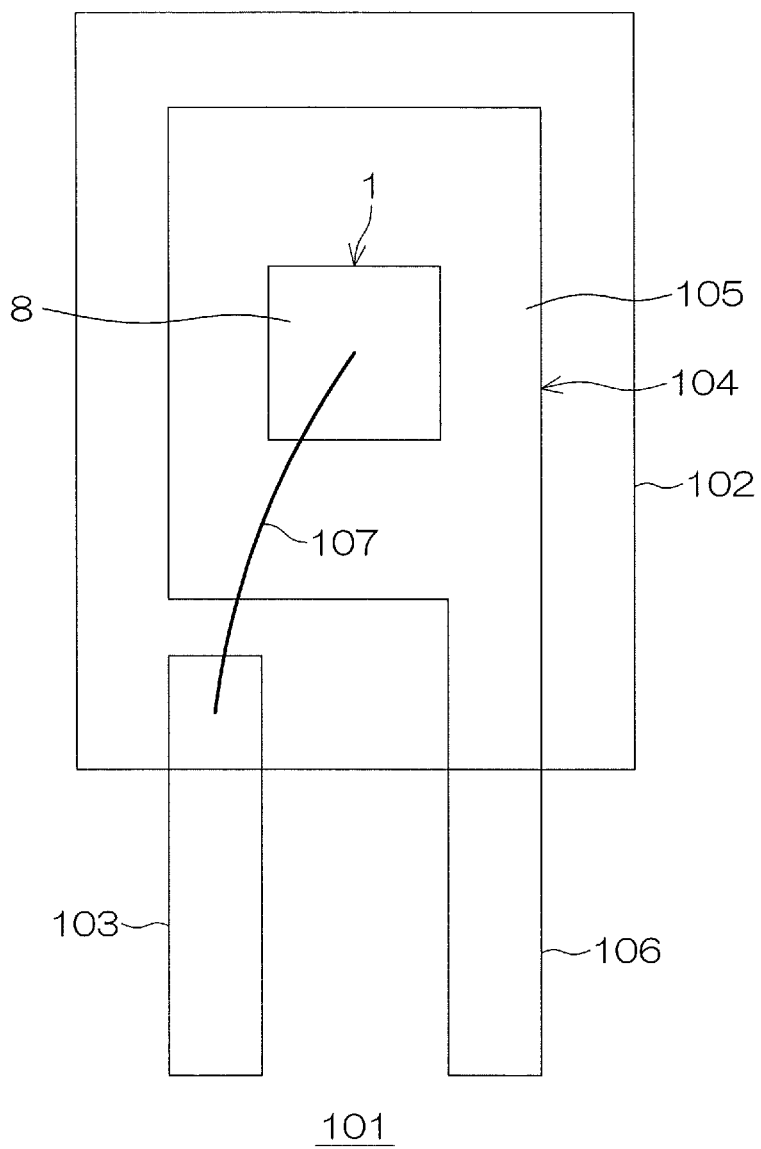
FIG. 16 is a general arrangement diagram of a semiconductor package in which the capacitor shown in FIG. 1

FIG. 16 is a general arrangement diagram of a semiconductor package in which the capacitor 1 shown in FIG. 1 and FIG. 2 is packaged.

The semiconductor package 101 includes a resin package 102 of flat rectangular parallelepiped shape and a first terminal 103 and a second terminal 104 that are sealed in the resin package 102.

The two terminals 103 and 104 are constituted of metal plates formed to predetermined shapes. In this preferred embodiment, the second terminal 104 is formed to a shape including an island 105 of square shape and a terminal portion 106 of elongate rectangular shape that extends rectilinearly from one side of the island 105. The first terminal 103 is formed to substantially the same shape as the terminal portion 106 of the second terminal 104 and is disposed in a state of being parallel to the terminal portion 106 of the second terminal 104.

The capacitor 1 is die bonded on the second terminal 104 (a central portion of the island 105). The island 105 is bonded from below to the second external electrode 10 of the capacitor 1.

The first terminal 103 is connected to the first external electrode 8 of the capacitor 1 using a bonding wire 107.

Although the first and second preferred embodiments of the present invention have been described above, the present invention can be implemented in yet other preferred embodiments. For example, the lateral cross-sectional shapes of the first internal electrode forming penetrating holes 3 and the second internal electrode forming penetrating holes 4 are not restricted to the shapes mentioned above and may be of any shape. The lateral cross-sectional shapes of the first internal electrode forming penetrating holes 3 and the second internal electrode forming penetrating holes 4 may, for example, be of rectangular shapes that are long in one direction. In this case, the first internal electrodes 5 and the second internal electrodes 6 will be of flat planar shapes.

Also, although in the preferred embodiments described above, the plurality of internal electrode forming penetrating holes 3 and 4 that include the plurality of first internal electrode forming penetrating holes 3 and the plurality of second internal electrode forming penetrating holes 4 are disposed in a lattice (in a matrix or in a staggered arrangement), the holes do not have to be disposed in a lattice. For example, the holes may be aligned in a single column.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2020-043084 filed on Mar. 12, 2020 in the Japan Patent Office, and the entire disclosure of this application is incorporated herein by reference.

REFERENCE SIGNS LIST 1, 1A capacitor
2 substrate
2a first principal surface
2b second principal surface
3 first internal electrode forming penetrating hole
4 second internal electrode forming penetrating hole
5 first internal electrode
5A seed layer
5B internal electrode layer
6 second internal electrode 6A seed layer
6B internal electrode layer
7 first insulating film
7a first contact hole
7b third contact hole
8 first external electrode
8A seed layer
8B external electrode layer
9 second insulating film
9a second contact hole
9b fourth contact hole
10 second external electrode
10A seed layer
10B external electrode layer
21 external electrode connection penetrating hole
22 external electrode connecting member
22A seed layer
22B external electrode connecting layer
40 base substrate
81 main first external electrode
81A seed layer
81B external electrode layer
82 sub first external electrode
82A seed layer
82B external electrode layer

The invention claimed is:

1. A capacitor comprising:
a substrate that has a first principal surface at one side and a second principal surface at another side;
a plurality of first internal electrode forming penetrating holes that are formed in a first region of the substrate and penetrate through the substrate in a thickness direction, each having a same cross-sectional area;
a plurality of second internal electrode forming penetrating holes that are formed in the first region of the substrate and penetrate through the substrate in the thickness direction, each having a same cross-sectional area;
a plurality of external electrode connection penetrating holes that are formed in a second region different from the first region of the substrate and penetrate through the substrate in the thickness direction, each having a same cross-sectional area;
first internal electrodes that are constituted of conductors embedded inside the plurality of first internal electrode forming penetrating holes;
second internal electrodes that are constituted of conductors embedded inside the plurality of second internal electrode forming penetrating holes;
external electrode connecting members that are constituted of conductors embedded inside the plurality of external electrode connection penetrating holes;
a first insulating film that is formed on the first principal surface so as to cover first principal surface side end portions of the second internal electrodes and has first contact holes exposing first principal surface side end portions of the first internal electrodes and has third contact holes exposing first principal surface side end portions of the external electrode connecting members;
a second insulating film that is formed on the second principal surface so as to cover second principal surface side end portions of the first internal electrodes and has second contact holes exposing second principal surface side end portions of the second internal electrodes and has fourth contact holes exposing second principal surface side end portions of the external electrode connecting members;
a main first external electrode that is formed on the first principal surface so as to cover the first principal surface side end portions of the first internal electrodes and cover the first principal surface side end portions of the external electrode connecting members and to which the first internal electrodes and the external electrode connecting members are electrically connected;
a second external electrode that is formed on the second principal surface so as to cover the second principal surface side end portions of the second internal electrodes and to which the second internal electrodes are electrically connected; and
a sub first external electrode that is formed on the second principal surface so as to cover the second principal surface side end portions of the external electrode connecting members and to which the external electrode connecting members are electrically connected;
wherein the plurality of first internal electrode forming penetrating holes, the plurality of second internal electrode forming penetrating holes and the plurality of external electrode connection penetrating holes satisfy:
a first condition that the cross-sectional areas of the first internal electrode forming penetrating holes, the cross-sectional areas of the second internal electrode forming penetrating holes and the cross-sectional areas of the external electrode connection penetrating holes are equal,
a second condition that a plurality of penetrating holes consisting of all of the plurality of first internal electrode forming penetrating holes and the plurality of second internal electrode forming penetrating holes are arranged in a matrix in a plan view so as to line up in each of a first direction and a second direction perpendicular to the first direction in the first region,
a third condition that the plurality of first internal electrode forming penetrating holes and the plurality of second internal electrode forming penetrating holes are arranged alternately in the first direction and also alternately in the second direction, and
a fourth condition that the plurality of external electrode connection penetrating holes are arranged in a row at intervals in the first direction in the second region, and are arranged one by one on an extension line of each of rows in which the plurality of first internal electrode forming penetrating holes and the plurality of second internal electrode forming penetrating holes are arranged alternately in the second direction.

2. The capacitor according to claim 1,
wherein
the main first external electrode enters into the first contact holes and is connected to the first internal electrodes inside the first contact holes and enters into the third contact holes and is connected to the external electrode connecting members inside the third contact holes,
the second external electrode enters into the second contact holes and is connected to the second internal electrodes inside the second contact holes, and
the sub first external electrode enters into the fourth contact holes and is connected to the external electrode connecting members inside the fourth contact holes.

3. The capacitor according to claim 1, wherein an aspect ratio of the plurality of first internal electrode forming penetrating holes and the plurality of second internal electrode forming penetrating holes is not less than 50.

4. The capacitor according to claim 1, wherein a depth of the plurality of first internal electrode forming penetrating holes, the plurality of second internal electrode forming penetrating holes and the plurality of external electrode connection penetrating holes is not less than 100 µm.

5. The capacitor according to claim 4, wherein a maximum width or maximum diameter of a lateral cross section of the plurality of first internal electrode forming penetrating holes, the plurality of second internal electrode forming penetrating holes and the plurality of external electrode connection penetrating holes is not less than 0.3 µm and not more than 10 µm.

6. The capacitor according to claim 4, wherein a distance between electrodes of the first internal electrodes and the second internal electrodes is not less than 0.3 µm and not more than 10 µm.

7. The capacitor according to claim 1, wherein the conductors are constituted of one arbitrarily selected from among Cu, Al, Pt, Au, Ag, Ni, and polysilicon.

\* \* \* \* \*